(12) United States Patent
Little

(10) Patent No.: US 10,559,930 B2
(45) Date of Patent: Feb. 11, 2020

(54) INTERCONNECTION SYSTEM

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Terrance F. Little, Fullerton, CA (US)

(73) Assignees: FOXCONN (KUNSHAN) COMPUTER CONNECTOR CO. LTD, Kunshan (CN); FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 0 days.

(21) Appl. No.: 16/373,664

(22) Filed: Apr. 3, 2019

(65) Prior Publication Data

US 2019/0312389 A1    Oct. 10, 2019

Related U.S. Application Data

(60) Provisional application No. 62/652,332, filed on Apr. 4, 2018.

(51) Int. Cl.
| | |
|---|---|
| H01R 12/00 | (2006.01) |
| H01R 13/659 | (2011.01) |
| H01R 12/72 | (2011.01) |
| H01R 12/71 | (2011.01) |
| H01R 13/6582 | (2011.01) |
| H01R 13/6594 | (2011.01) |
| H01R 13/66 | (2006.01) |
| H01R 13/6587 | (2011.01) |

(52) U.S. Cl.
CPC ......... *H01R 13/659* (2013.01); *H01R 12/716* (2013.01); *H01R 12/721* (2013.01); *H01R 13/6582* (2013.01); *H01R 13/6587* (2013.01); *H01R 13/6594* (2013.01); *H01R 13/6658* (2013.01)

(58) Field of Classification Search
CPC .................................................... H01R 12/59
USPC .................................................... 439/77, 79
See application file for complete search history.

(56) References Cited

U.S. PATENT DOCUMENTS

| | | | |
|---|---|---|---|
| 7,744,416 B2 | 6/2010 | Hon Hai | |
| 7,857,630 B2* | 12/2010 | Hermant | H01R 13/6473 439/63 |
| 8,740,644 B2* | 6/2014 | Long | G02B 6/0001 439/541.5 |
| 8,845,364 B2 | 9/2014 | Molex | |
| 9,011,177 B2 | 4/2015 | Molex | |
| 9,553,381 B2 | 1/2017 | Molex | |

(Continued)

*Primary Examiner* — Phuong K Dinh
(74) *Attorney, Agent, or Firm* — Wei Te Chung; Ming Chieh Chang

(57) ABSTRACT

An electrical receptacle connector is mounted within a metallic cage for mating with a SFP module received within the cage. The contacts of the cable receptacle connector are arranged with two groups, of which one are connected to the printed circuit board on which the cage is mounted, and the other are connected to the wires which are further connected to a board-mount receptacle connector mounted on another printed circuit board on which the CPU (Central Processing Unit) socket is mounted. Each board-mount receptacle connector corresponds to more than one cable receptacle connector.

9 Claims, 42 Drawing Sheets

(56) References Cited

U.S. PATENT DOCUMENTS

| | | | |
|---|---|---|---|
| 9,590,366 B1 | | 3/2017 | Tyco |
| 9,705,258 B2 | | 7/2017 | Te |
| 10,056,706 B2 | * | 8/2018 | Wanha ............... H01R 13/6587 |
| 10,135,211 B2 | * | 11/2018 | Lloyd .................... H01R 24/60 |
| 10,424,878 B2 | * | 9/2019 | Lloyd .................... H01R 4/023 |
| 2007/0160078 A1 | * | 7/2007 | Chen ....................... H04L 12/10 |
| | | | 370/463 |
| 2016/0218455 A1 | | 7/2016 | Samtec |
| 2017/0077643 A1 | | 3/2017 | Samtec |
| 2018/0006416 A1 | | 1/2018 | Molex |
| 2018/0034175 A1 | | 2/2018 | Molex |

* cited by examiner

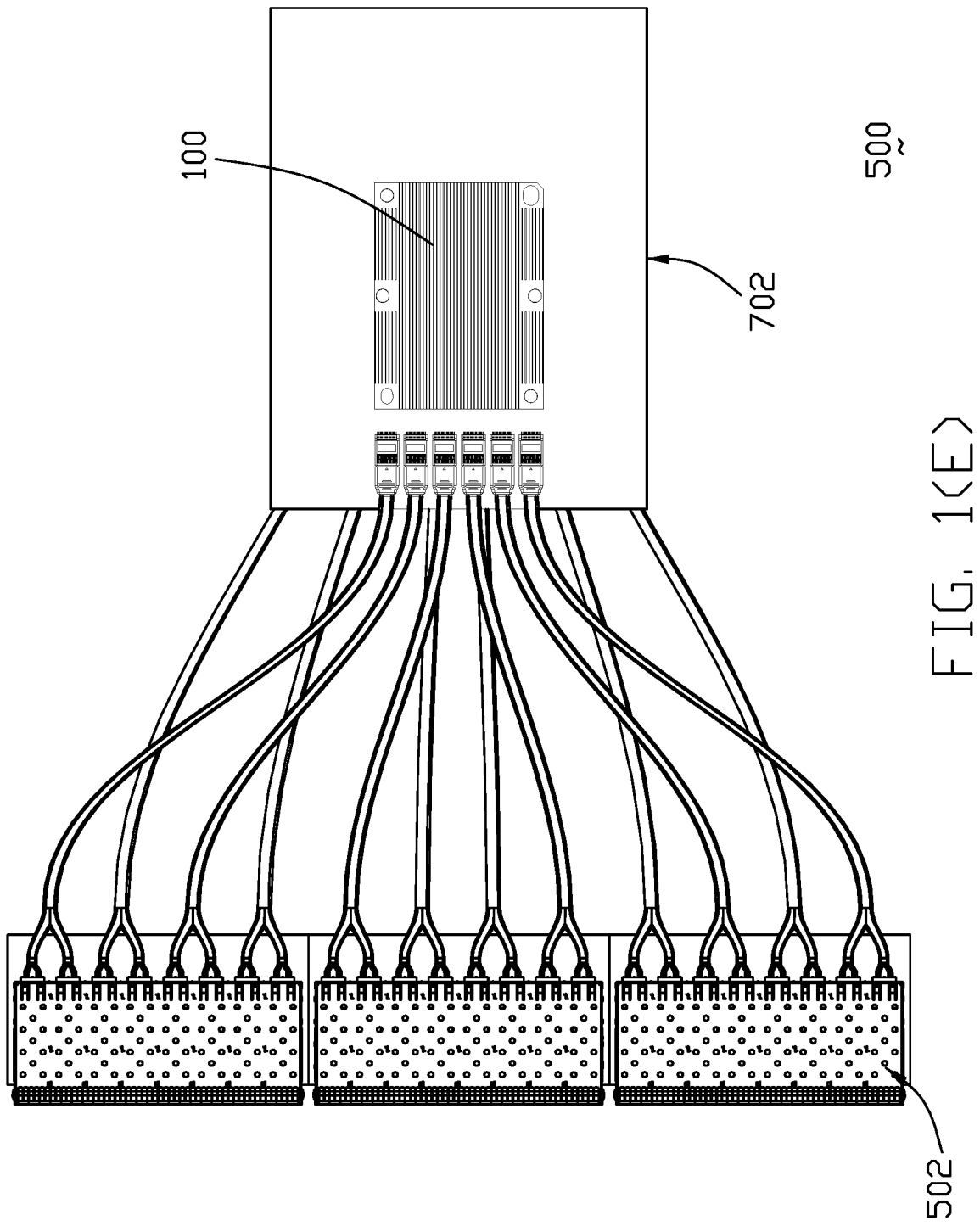

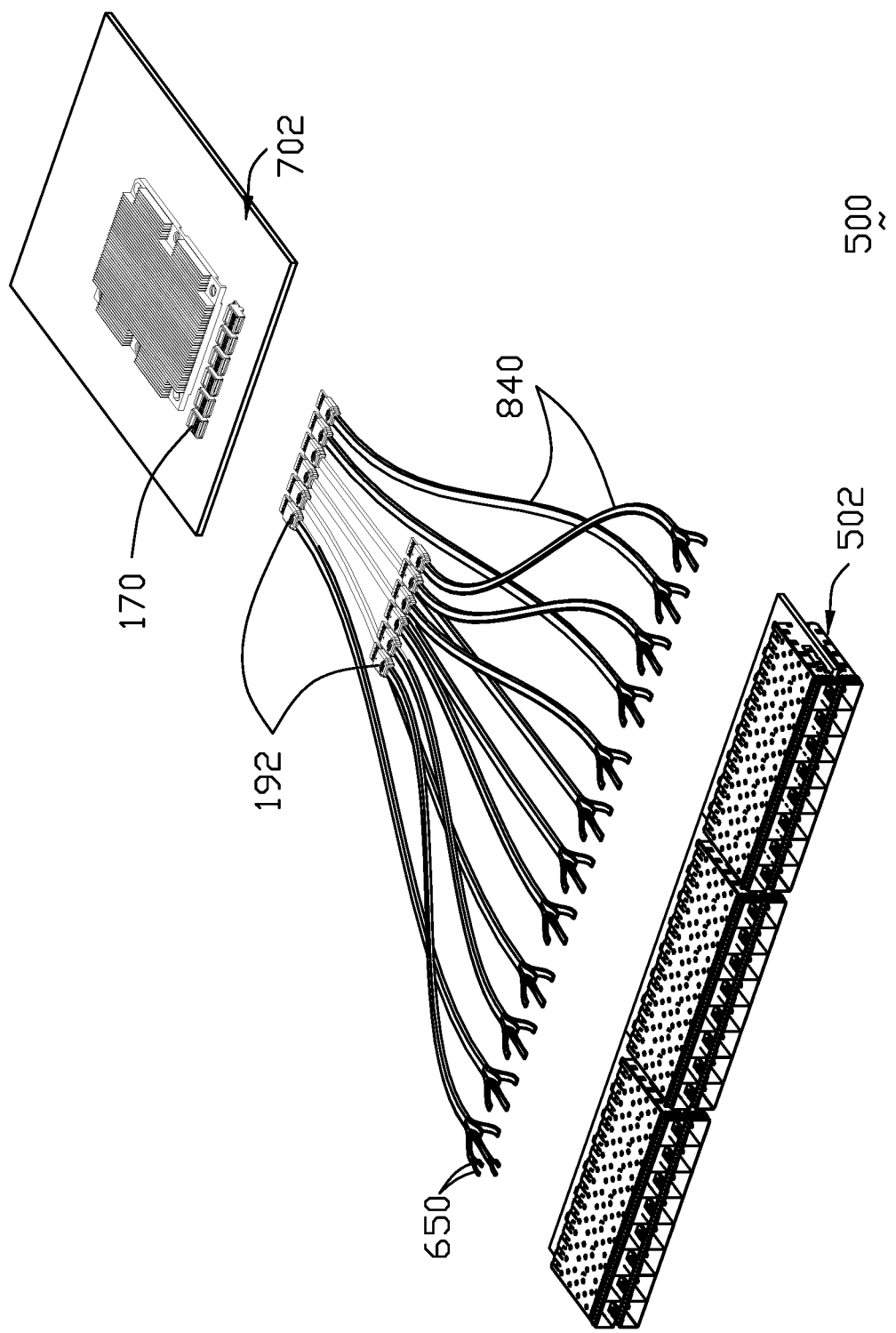

170

170

INTERCONNECTION SYSTEM

BACKGROUND OF THE INVENTION

1. Field of the Invention

The present invention relates to an electrical connector assembly, especially to the receptacle connector equipped with cable to transmit high speed signal instead of mounting to PCB by following the spirit of the previous designs of which the provisional applications have Ser. No. 62/367,098 filed on Jul. 26, 2016, 62/399,272 filed on Sep. 23, 2016, 62/412,841 filed on Oct. 26, 2016, 62/425,627 filed on Nov. 23, 2016, 62/449,133 filed on Jan. 23, 2017, 62/509,141 filed on May 21, 2017, 62/522,113 filed on Jun. 20, 2017, 62/533,131 filed on Jul. 17, 2017, 62/584,751 filed on Nov. 11, 2017, 62/614,366 filed on Jan. 6, 2018, 62/635,508 filed on Feb. 26, 2018, and 62/645,823 filed on Mar. 21, 2018.

2. Description of Related Arts

A traditional design between the receptacle connector, which is located at the rear end of the cage for coupling with a QSFP or other type module, and a CPU or an IC chip is through the traces on the printed circuit board on which the CPU socket is mounted. Anyhow, conductive traces on the printed circuit board have their own limitations for high speed high frequency signal transmission.

Therefore, a new arrangement for the QSFP or other type module connection without involvement via the traces on the printed circuit board but via the wires, is desired.

SUMMARY OF THE INVENTION

To achieve the above-mentioned object, an electrical cable receptacle connector is mounted within a metallic cage for mating with a SFP module received within the cage. The contacts of the cable receptacle connector are arranged with two groups, of which one are connected to the printed circuit board on which the cage is mounted, and the other are connected to the wires which are further connected to a board-mount receptacle connector mounted on another printed circuit board adjacent to the CPU (Central Processing Unit) or IC chip socket.

Other objects, advantages and novel features of the invention will become more apparent from the following detailed description when taken in conjunction with the accompanying drawings.

BRIEF DESCRIPTION OF THE DRAWINGS

FIG. 1(E) is a top view of the electrical interconnection system of FIG. 1(A);

FIG. 2(A) is an exploded perspective view of the electrical interconnection system of FIG. 1(A);

DETAILED DESCRIPTION OF THE PREFERRED EMBODIMENT

Figure 1A:
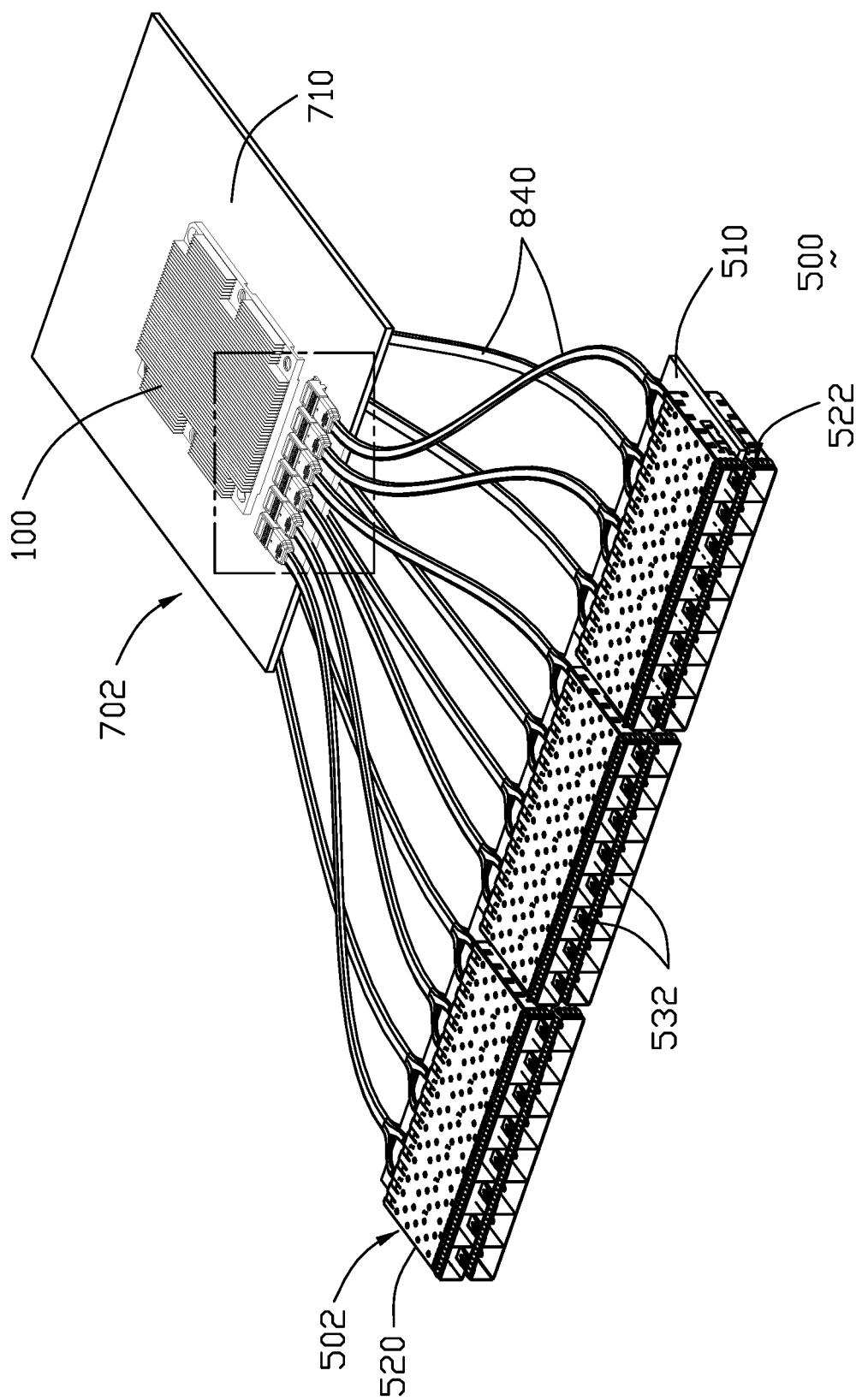
FIG. 1(A) is a perspective view of an electrical assembly or interconnection system according to the invention.
Figure 1B:
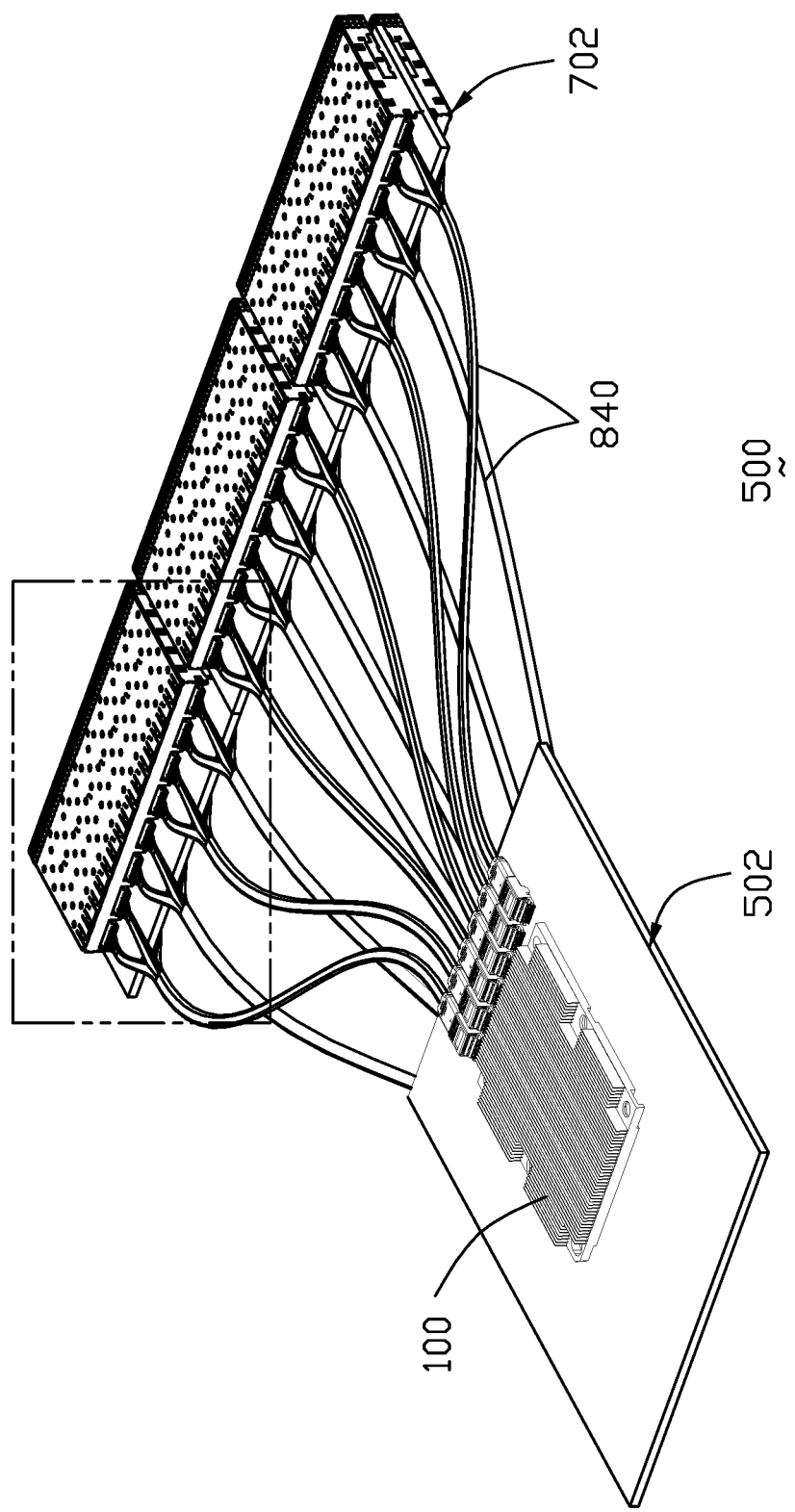
FIG. 1(B) is another perspective view of the electrical interconnection system of FIG. 1(A)
Figure 1C:
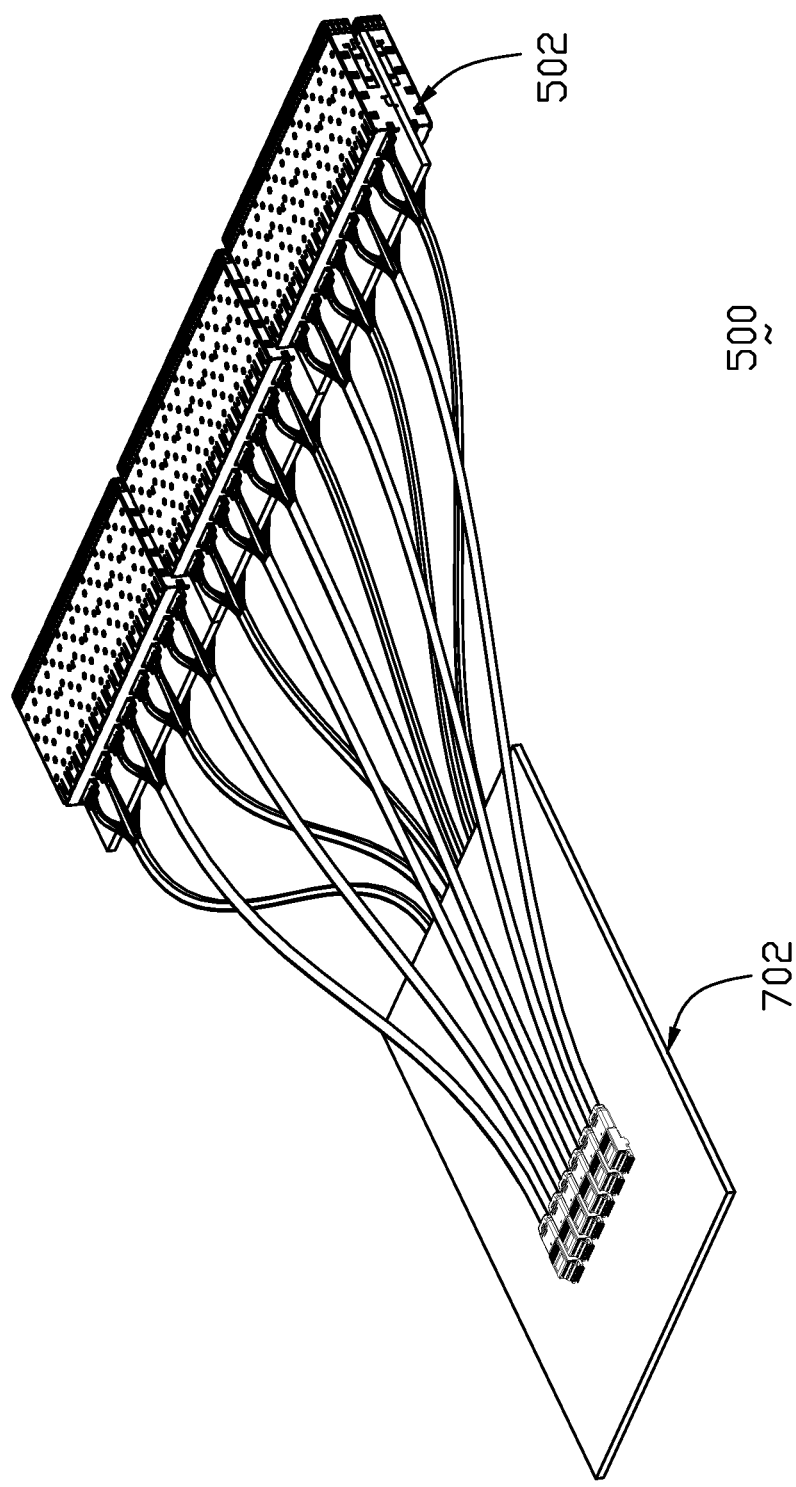
FIG. 1(C) is another perspective view of the electrical interconnection system of FIG. 1(A)
Figure 1D:
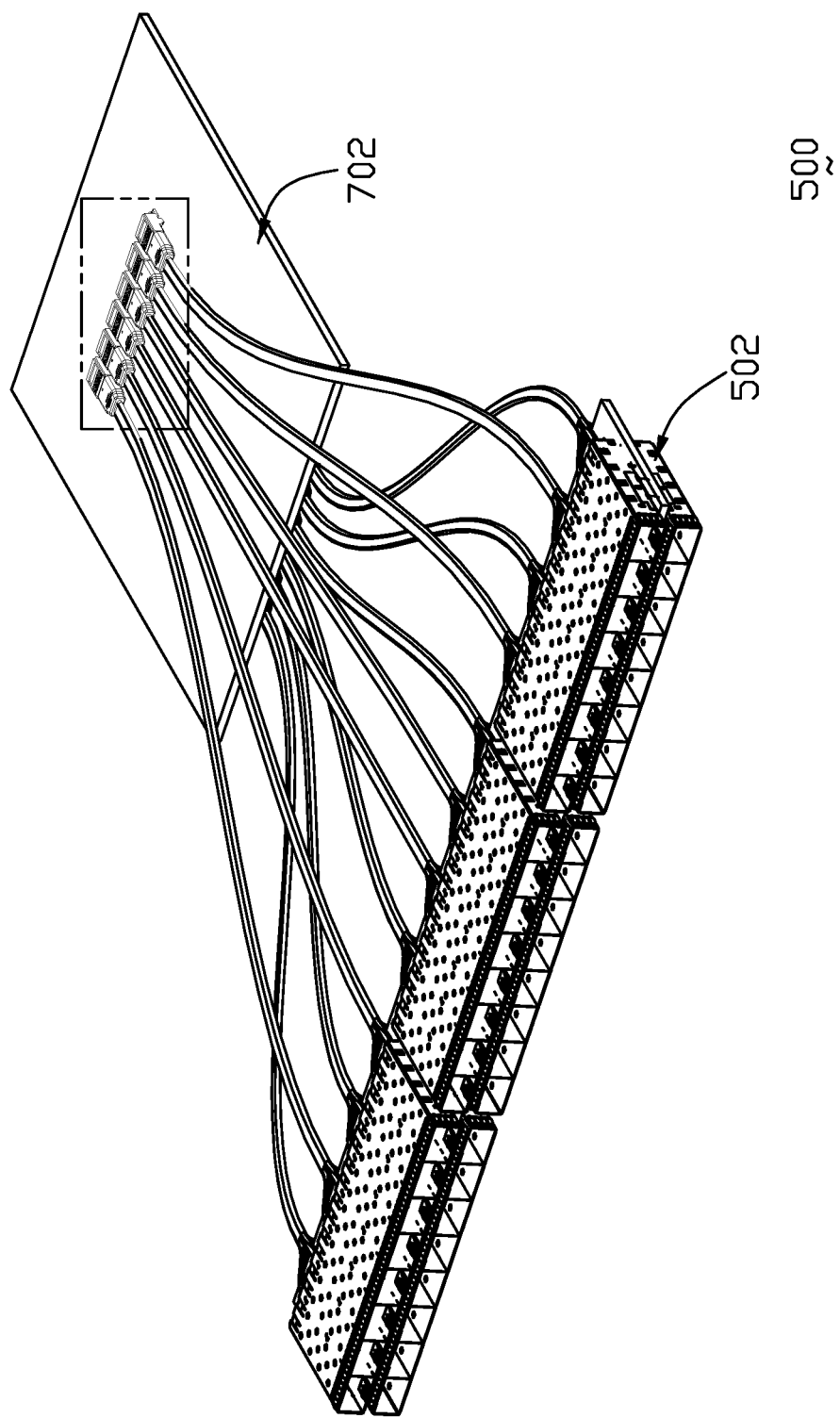
FIG. 1(D) is another perspective view of the electrical interconnection system of FIG. 1(A)
Figure 1F:
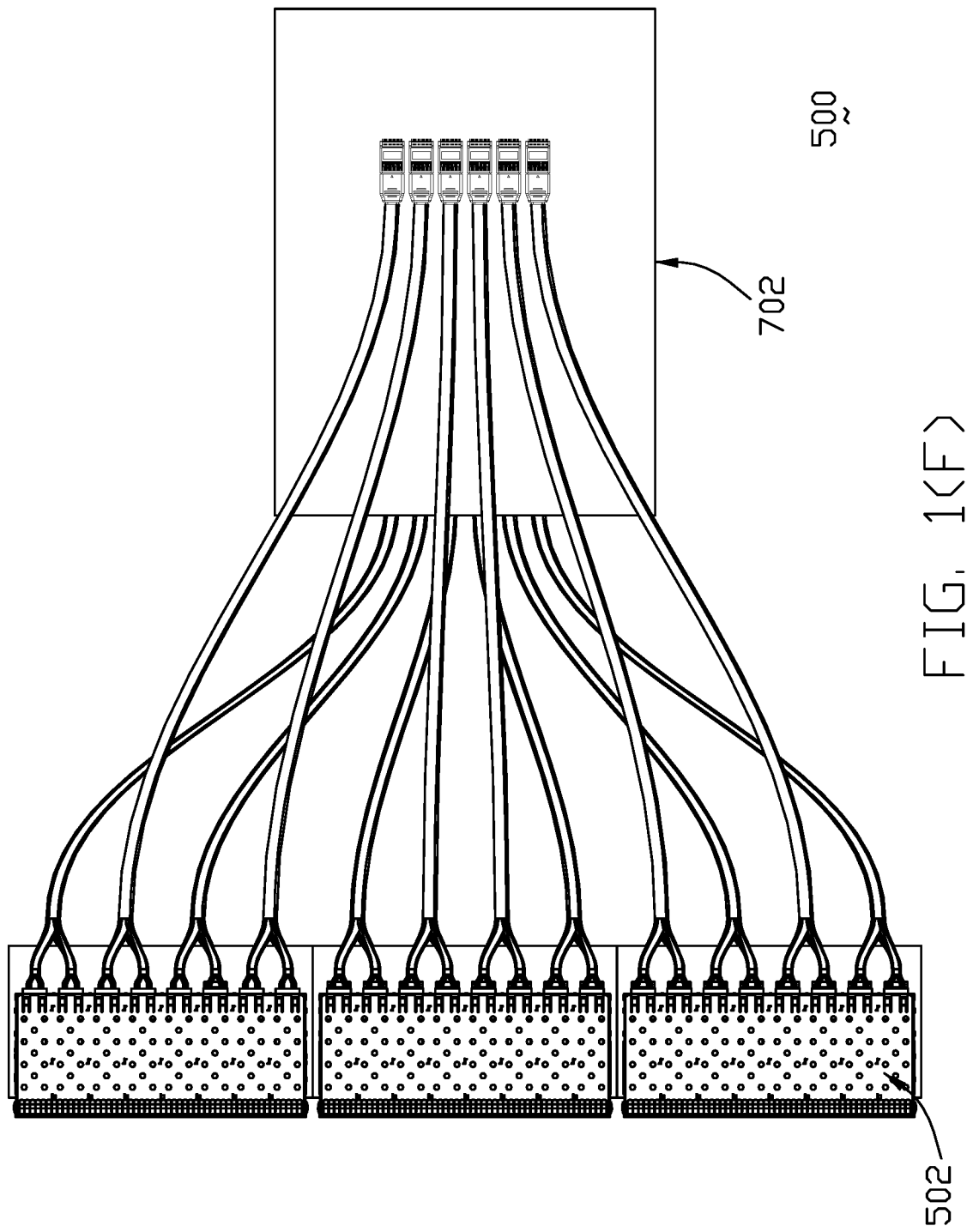
FIG. 1(F) is a bottom view of the electrical interconnection system of FIG. 1(A)
Figure 1G:
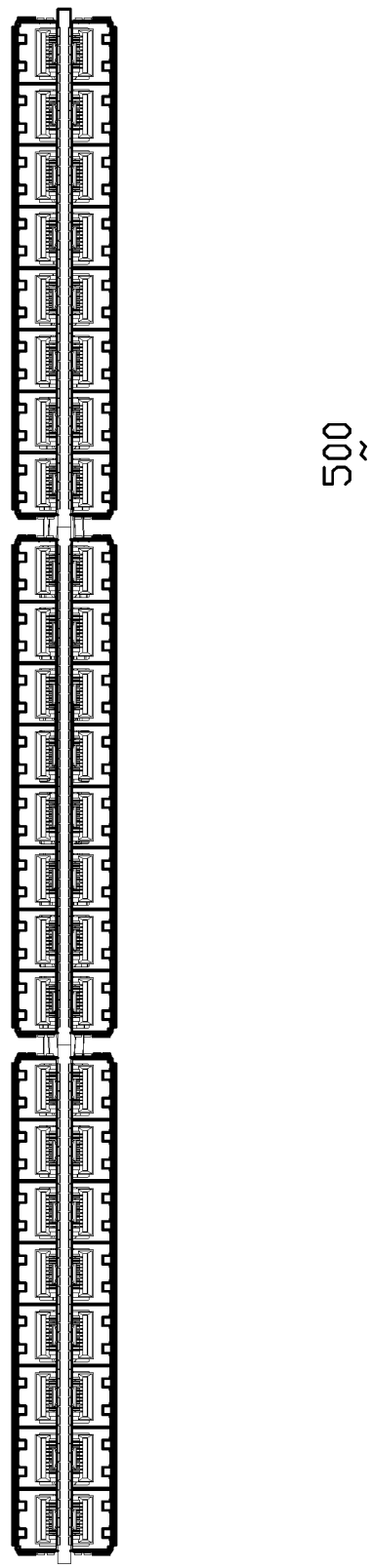
FIG. 1(G) is a front view of the electrical interconnection system of FIG. 1(A)
Figure 1H:
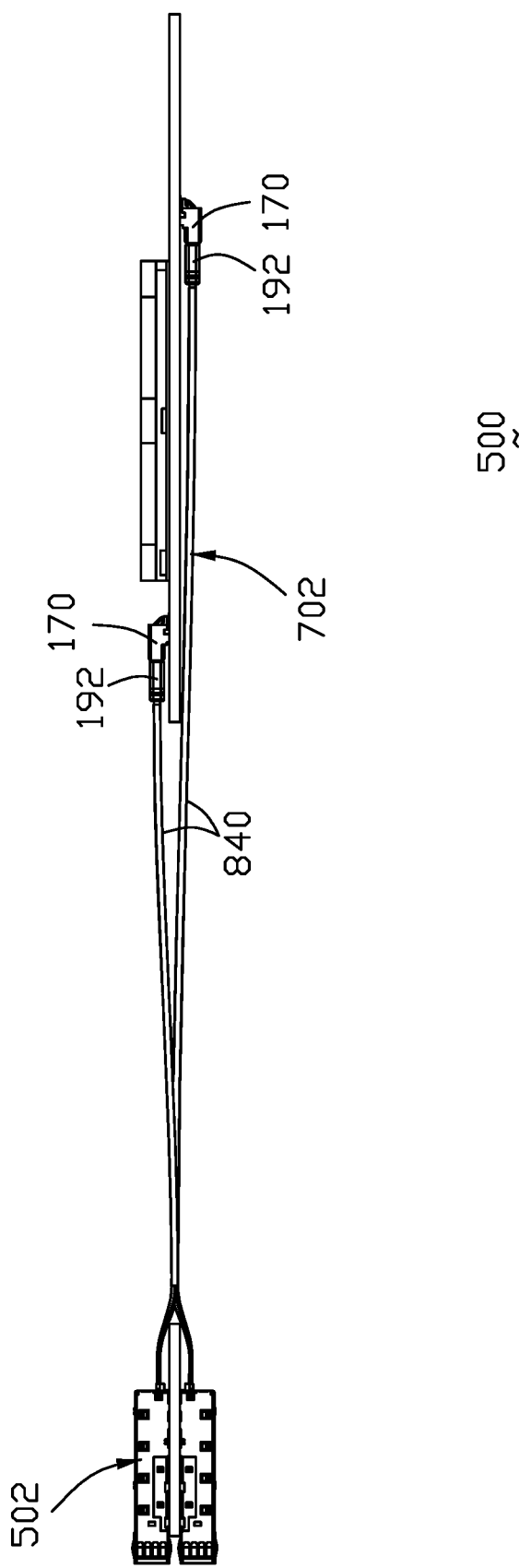
FIG. 1(H) is a side view of the electrical interconnection system of FIG. 1(A)
Figure 2B:
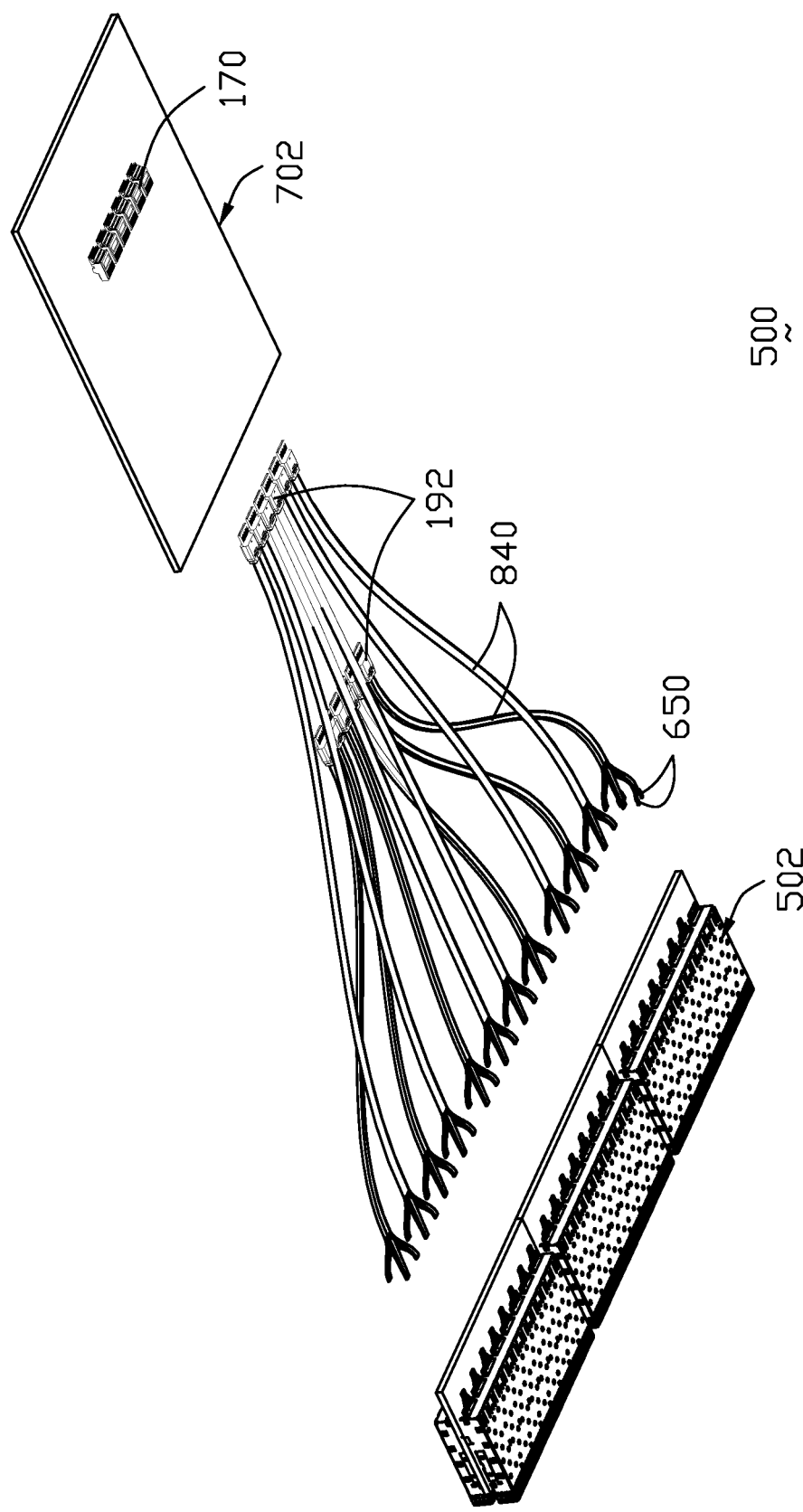
FIG. 2(B) is another exploded perspective view of the electrical interconnection system of FIG. 2(A)
Figure 3A:
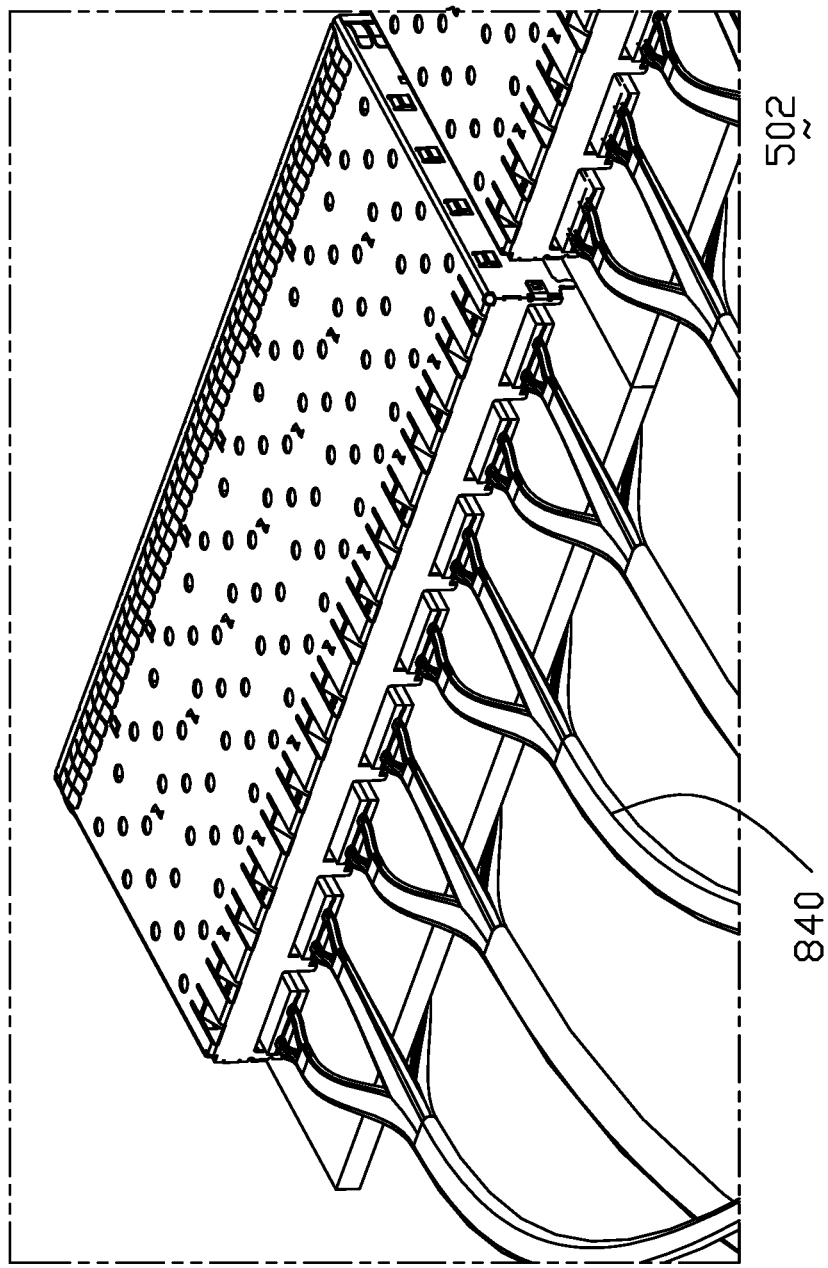
FIG. 3(A) is an enlarged perspective view of a portion of the periphery side of the interconnection system of FIG. 1(B)
Figure 3B:
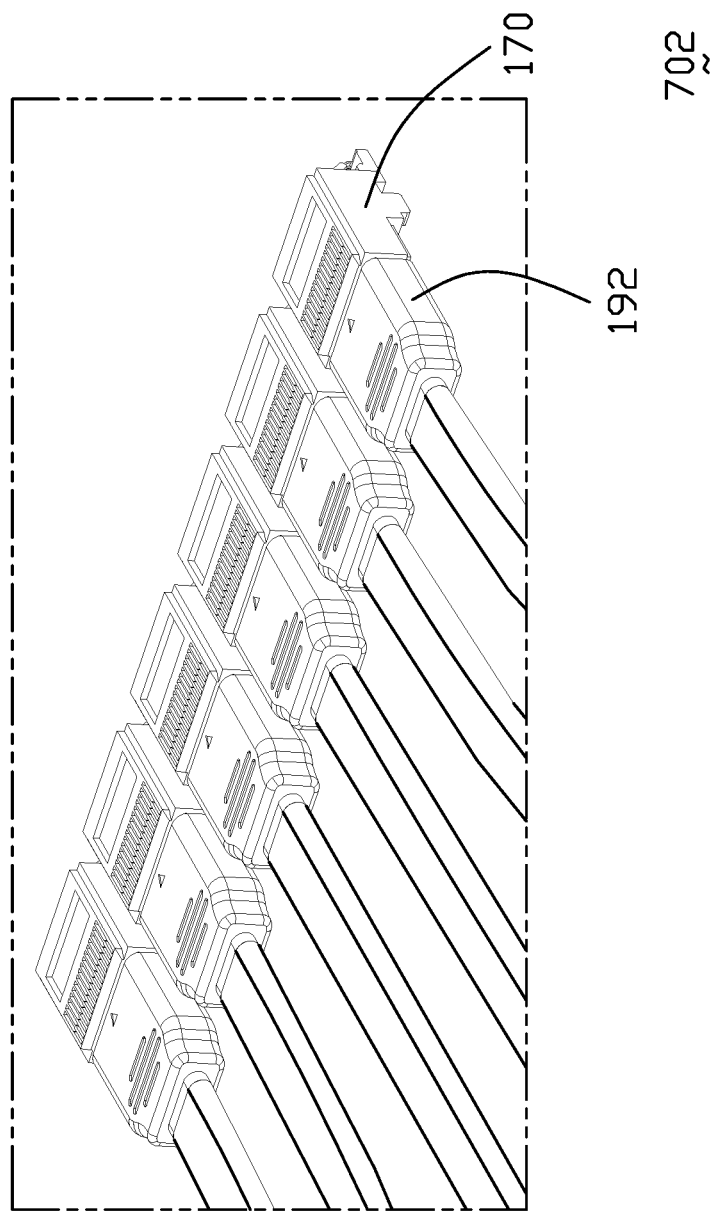
FIG. 3(B) is an enlarged perspective view of a portion of the system side of the interconnection system of FIG. 1(D)
Figure 3C:
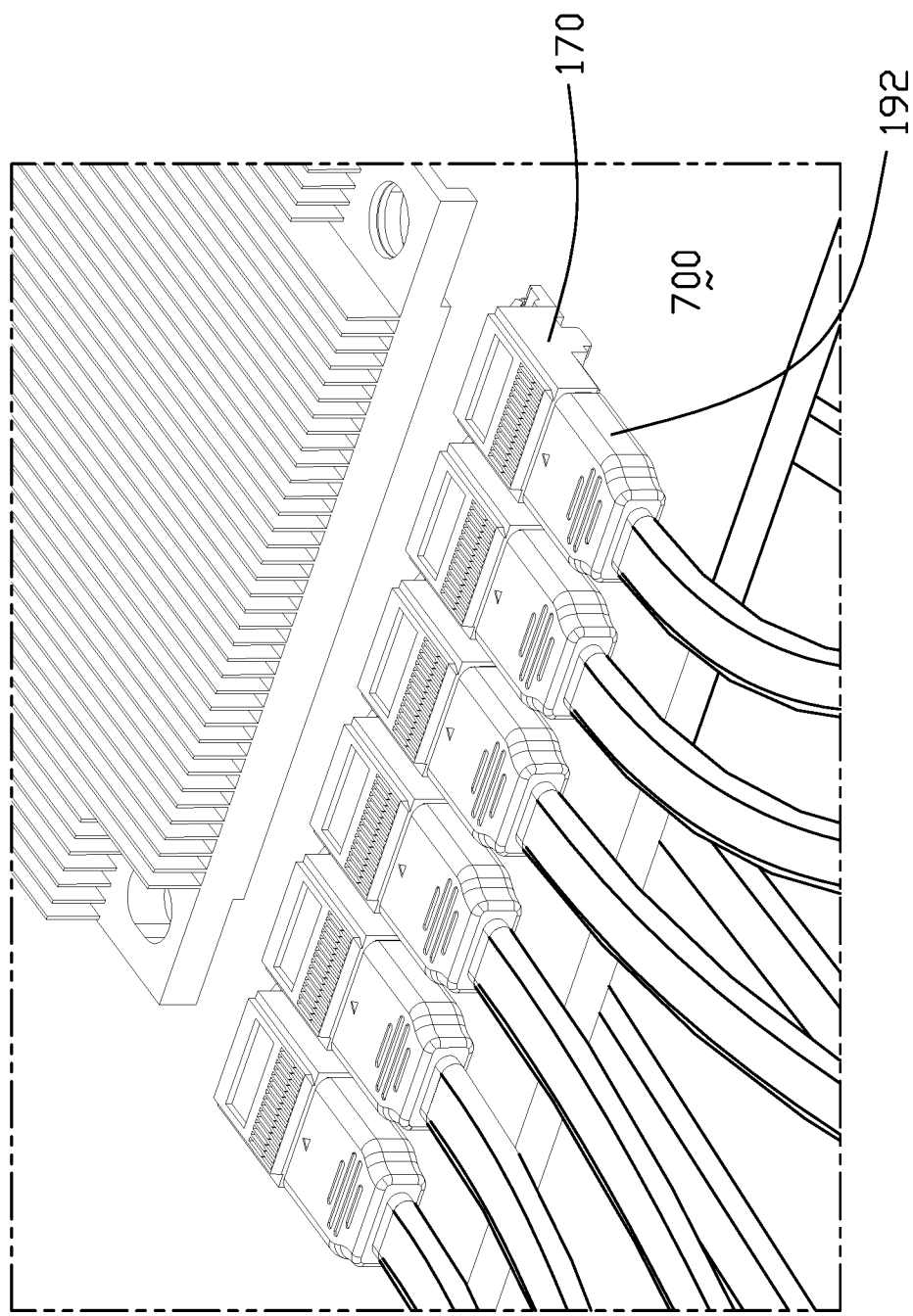
FIG. 3(C) is an enlarged perspective view of a portion of the system side of the interconnection system of FIG. 1(A)
Figure 4A:
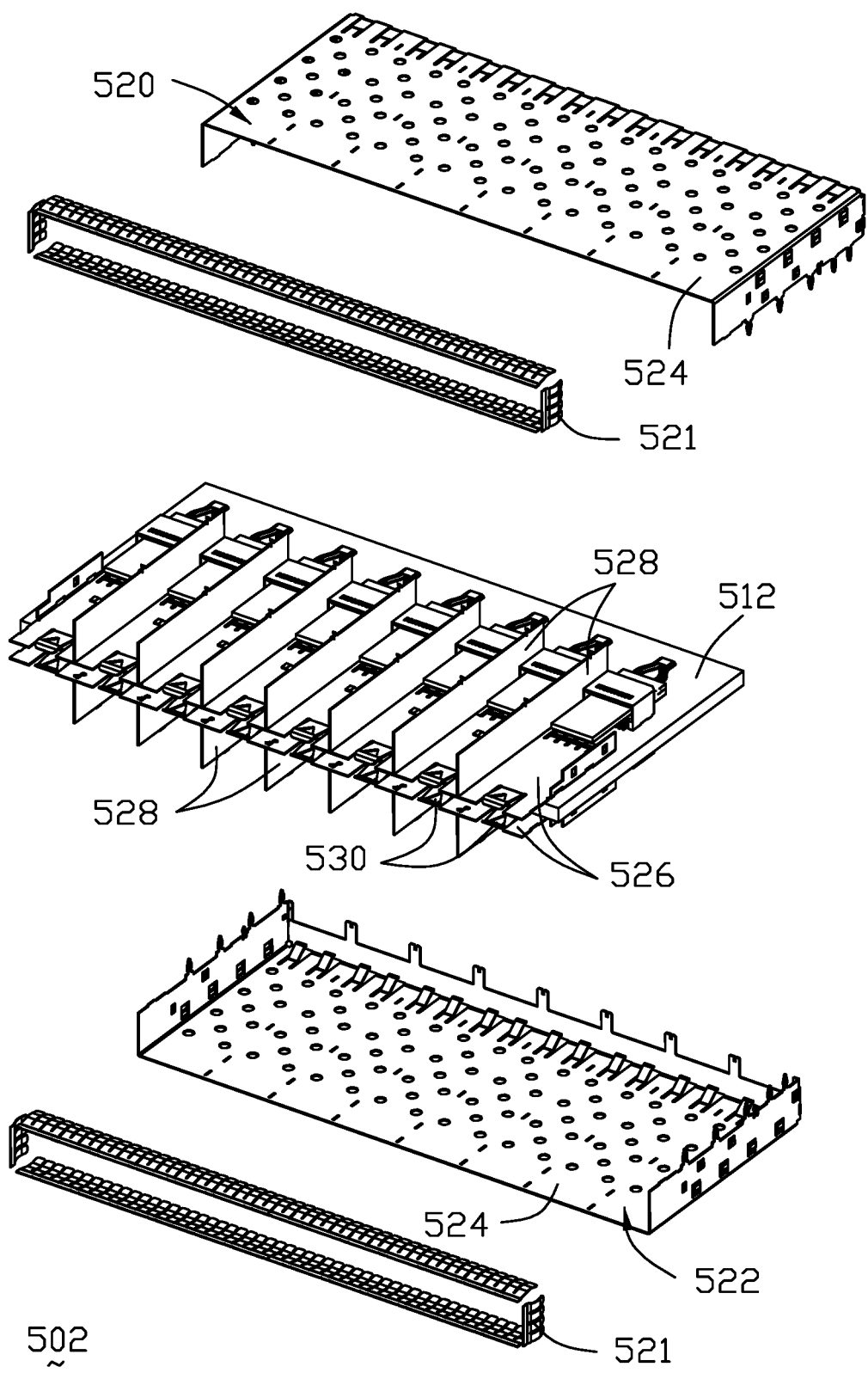
FIG. 4(A) is an exploded perspective view of the periphery side of the interconnection system of FIG. 1(A)
Figure 4B:
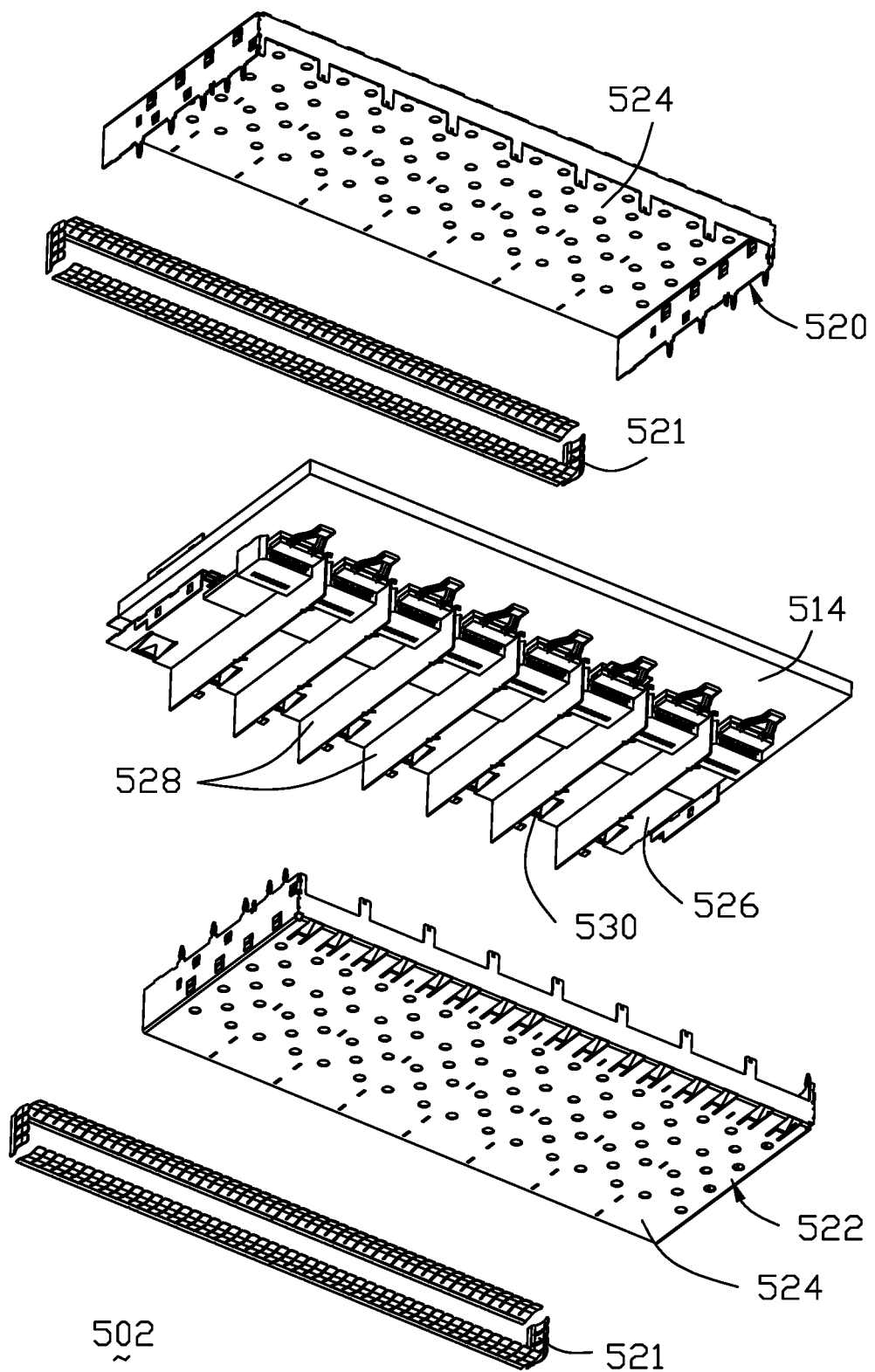
FIG. 4(B) is another exploded perspective view of the periphery side of the interconnection system of FIG. 4(A)
Figure 5A:
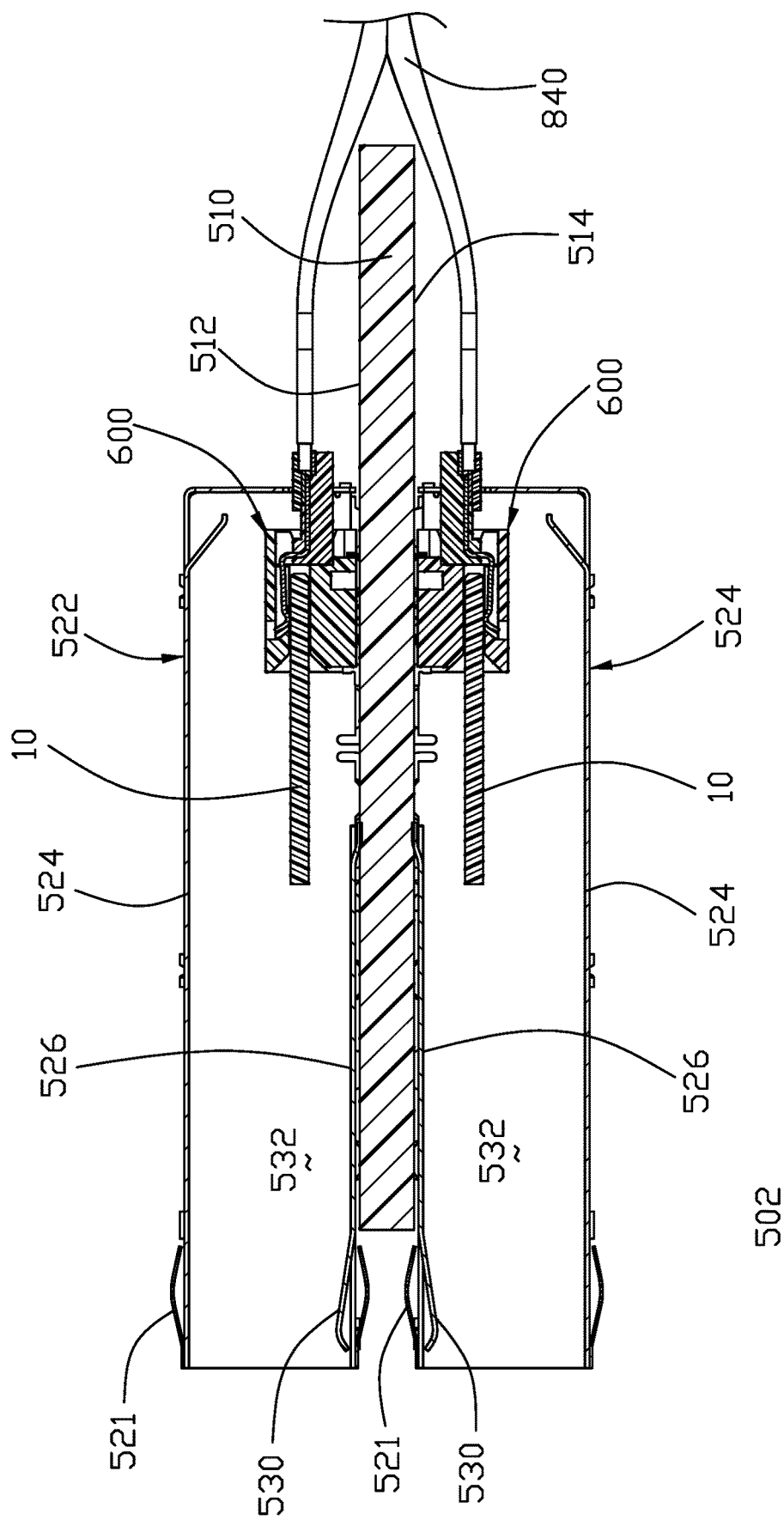
FIG. 5(A) is a cross-sectional view of the periphery side of the interconnection system of FIG. 1(A)
Figure 5B:
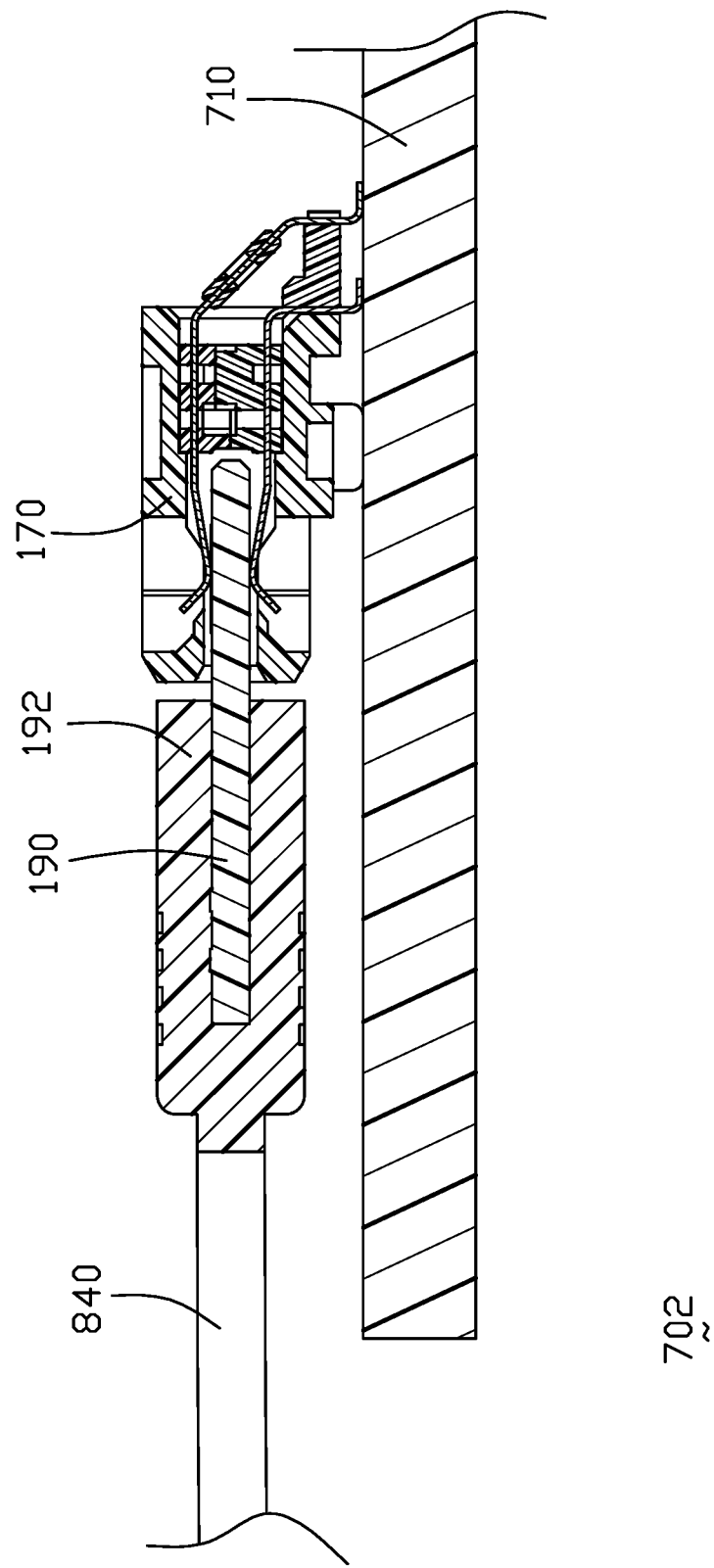
FIG. 5(B) is a cross-sectional view of the system side of the interconnection system of FIG. 1(A) around the top surface of the main board.
Figure 5C:
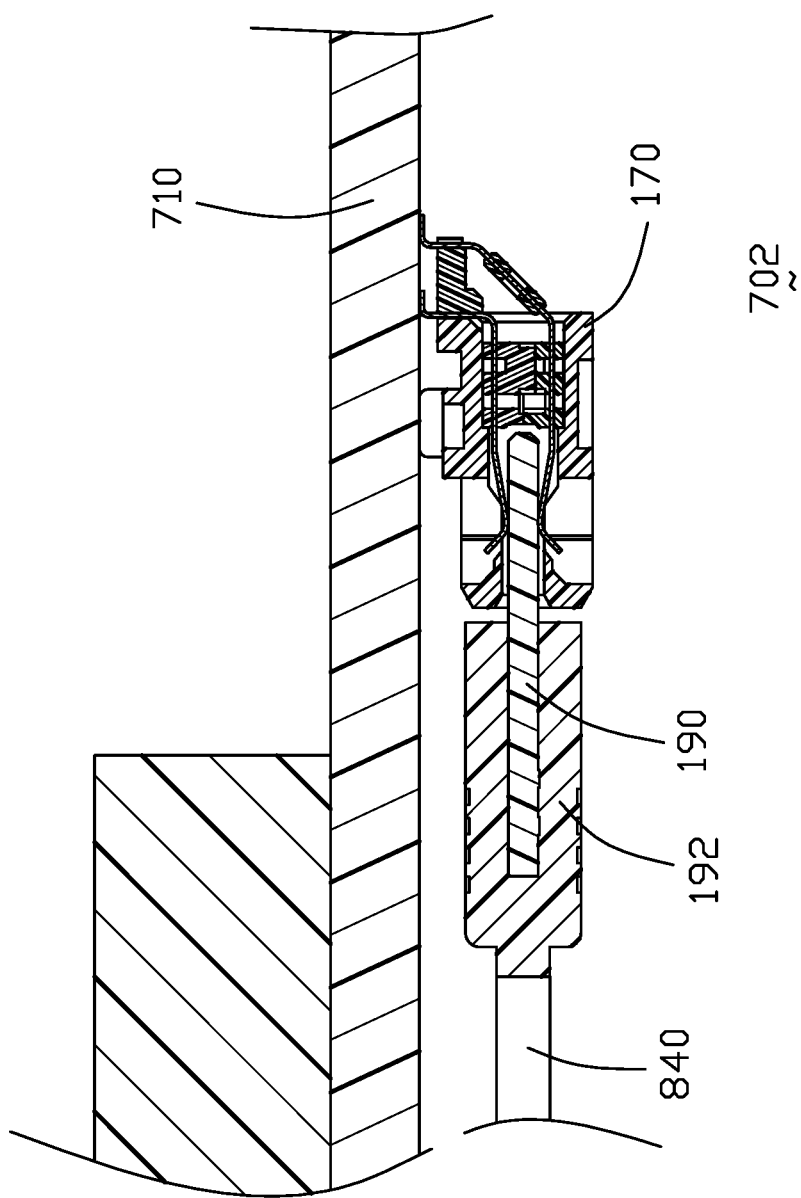
FIG. 5(C) is a cross-sectional view of the system side of the interconnecting system of FIG. 1(A) around the bottom surface of the main board.
Figure 6A:
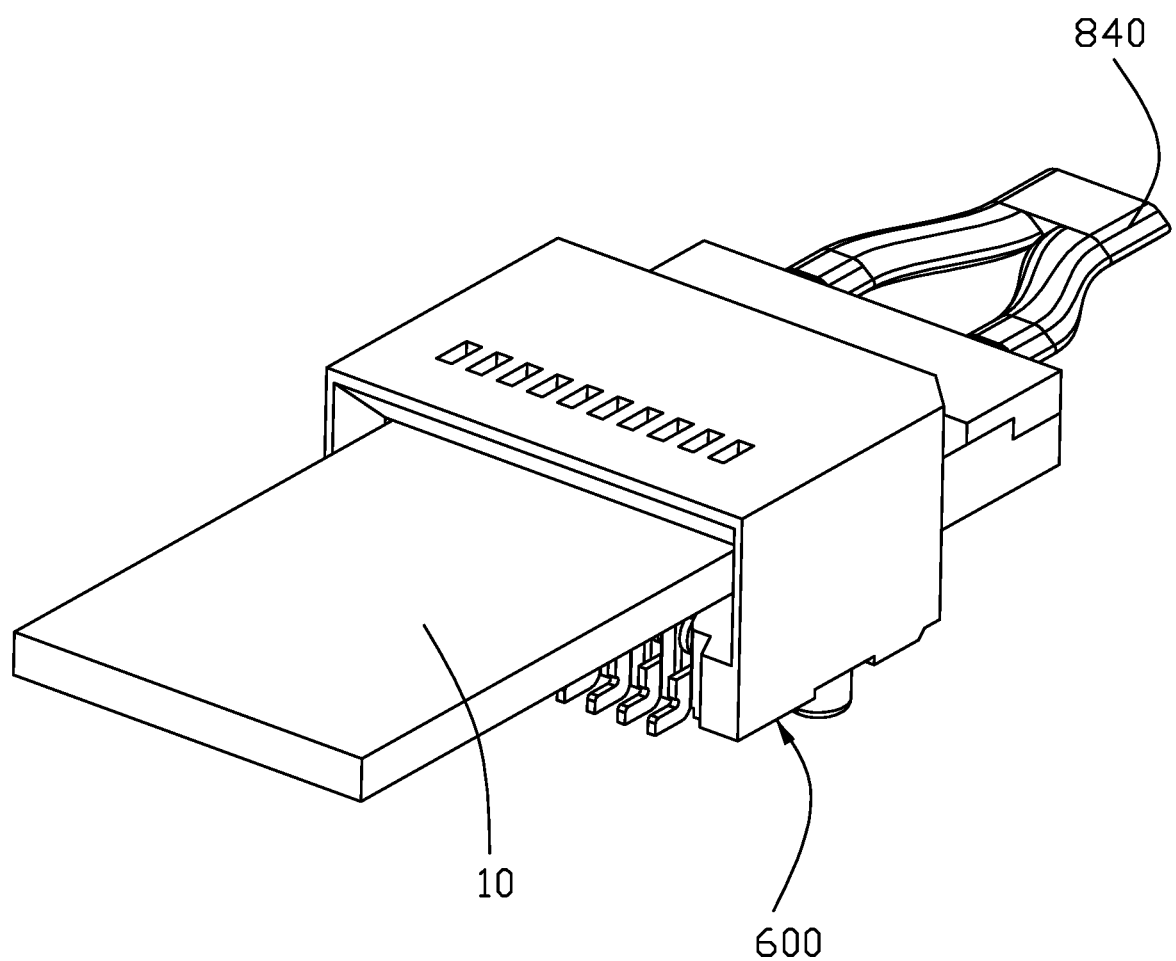
FIG. 6(A) is a perspective view of the cable receptacle connector with the mated mating tongue of the corresponding SFP module of the electrical interconnection system of FIG. 1.
Figure 6B:
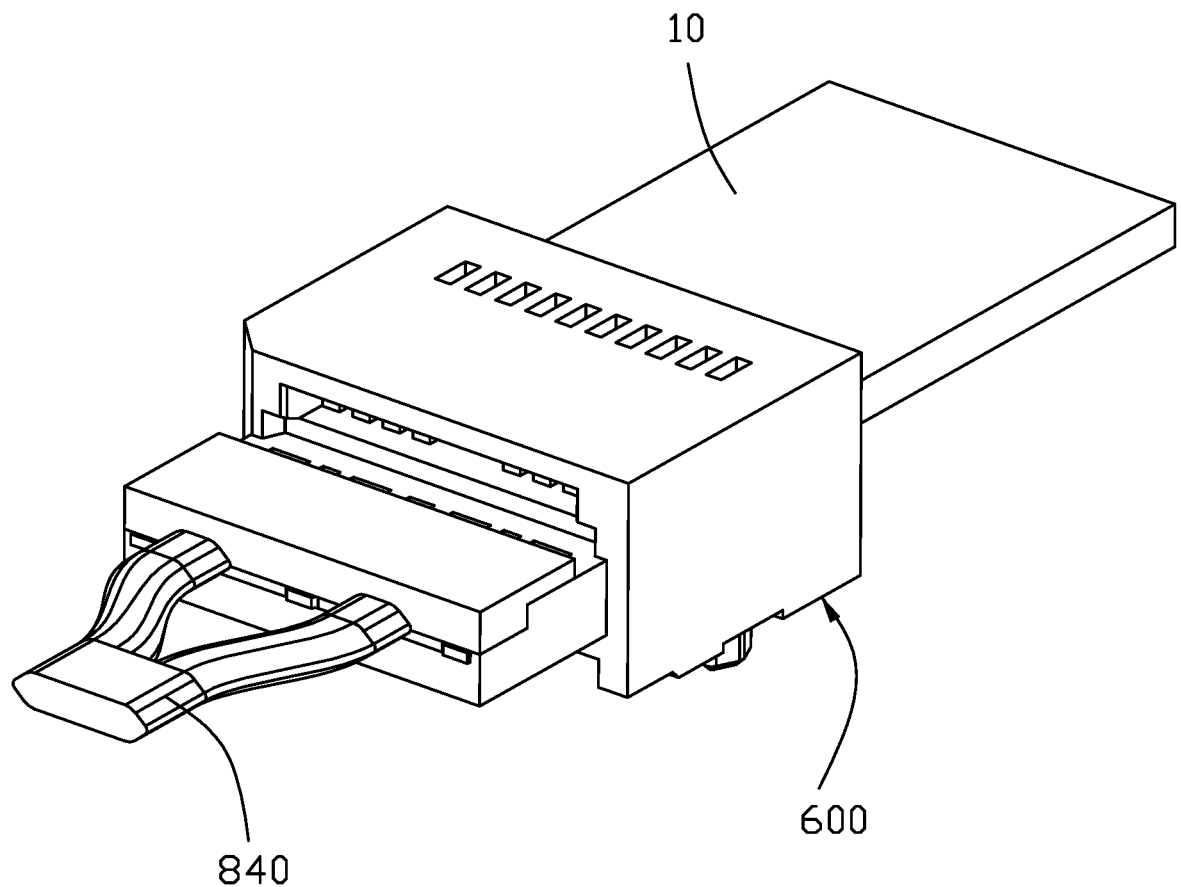
FIG. 6(B) is another perspective view of the cable receptacle connector with the mated mating tongue of the corresponding SFP module of the electrical interconnection system of FIG. 1.
Figure 7:
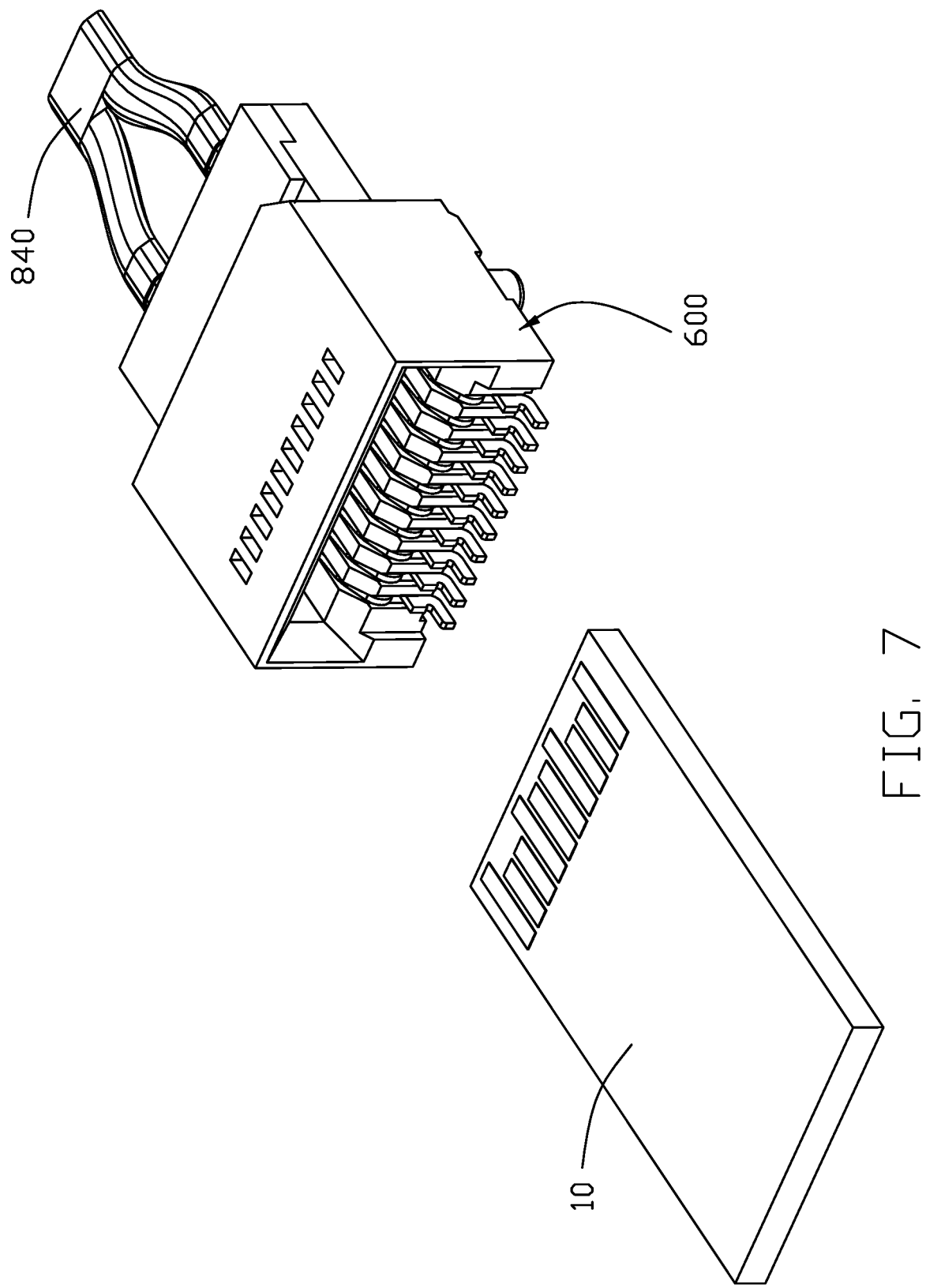
FIG. 7 is a perspective view of the cable receptacle connector and the mating tongue of the corresponding SFP module of the electrical interconnection system of FIG. 6(A) in a separated manner.
Figure 8A:
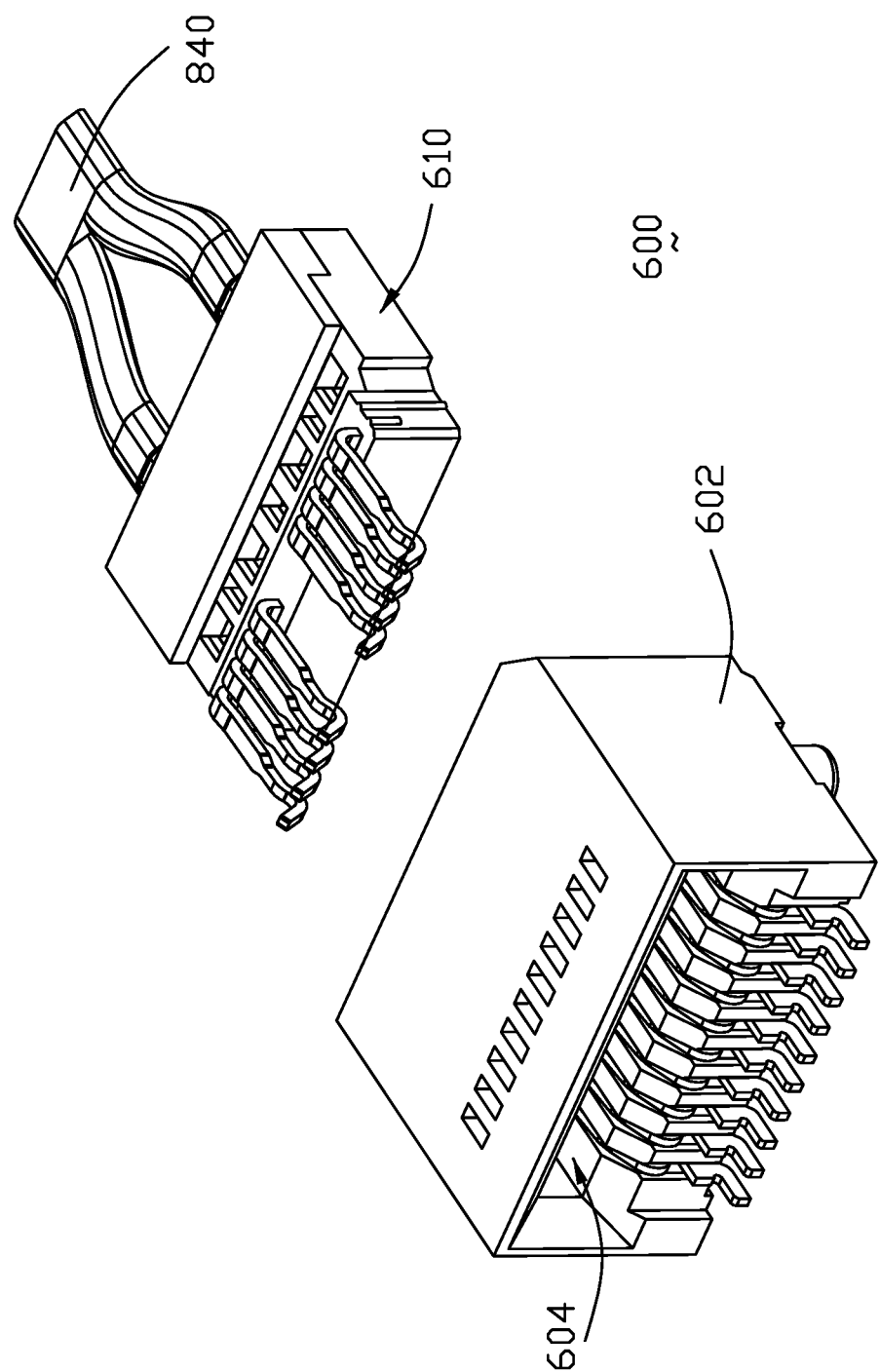
FIG. 8(A) is an exploded perspective view of the cable receptacle connector (contacts belonged to VCC not shown) with the associated cable of the electrical interconnection system of FIG. 1.
Figure 8B:
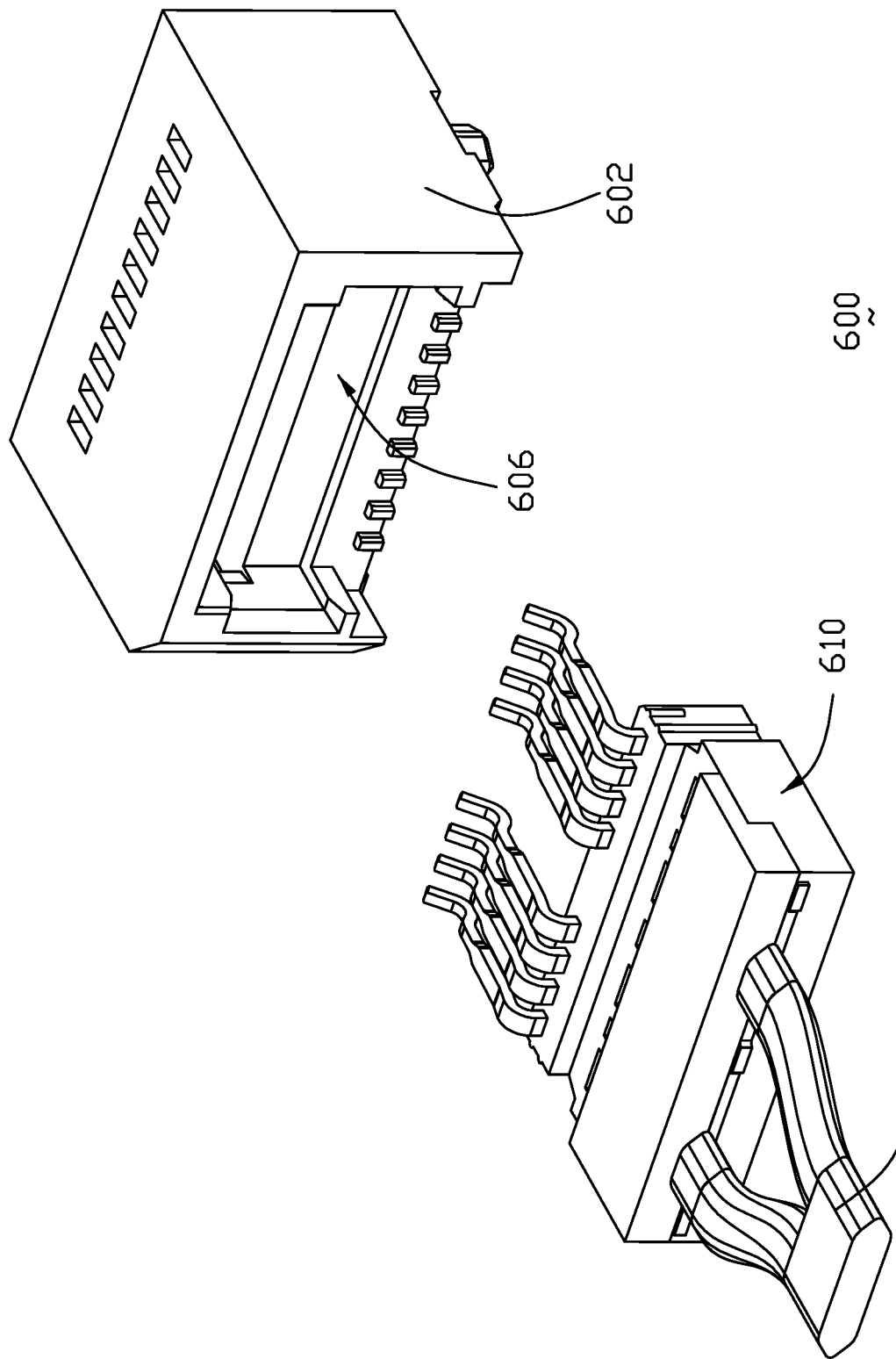
FIG. 8(B) is another exploded perspective view of the cable receptacle connector with the associated cable of the electrical interconnection system of FIG. 8(A)
Figure 8C:
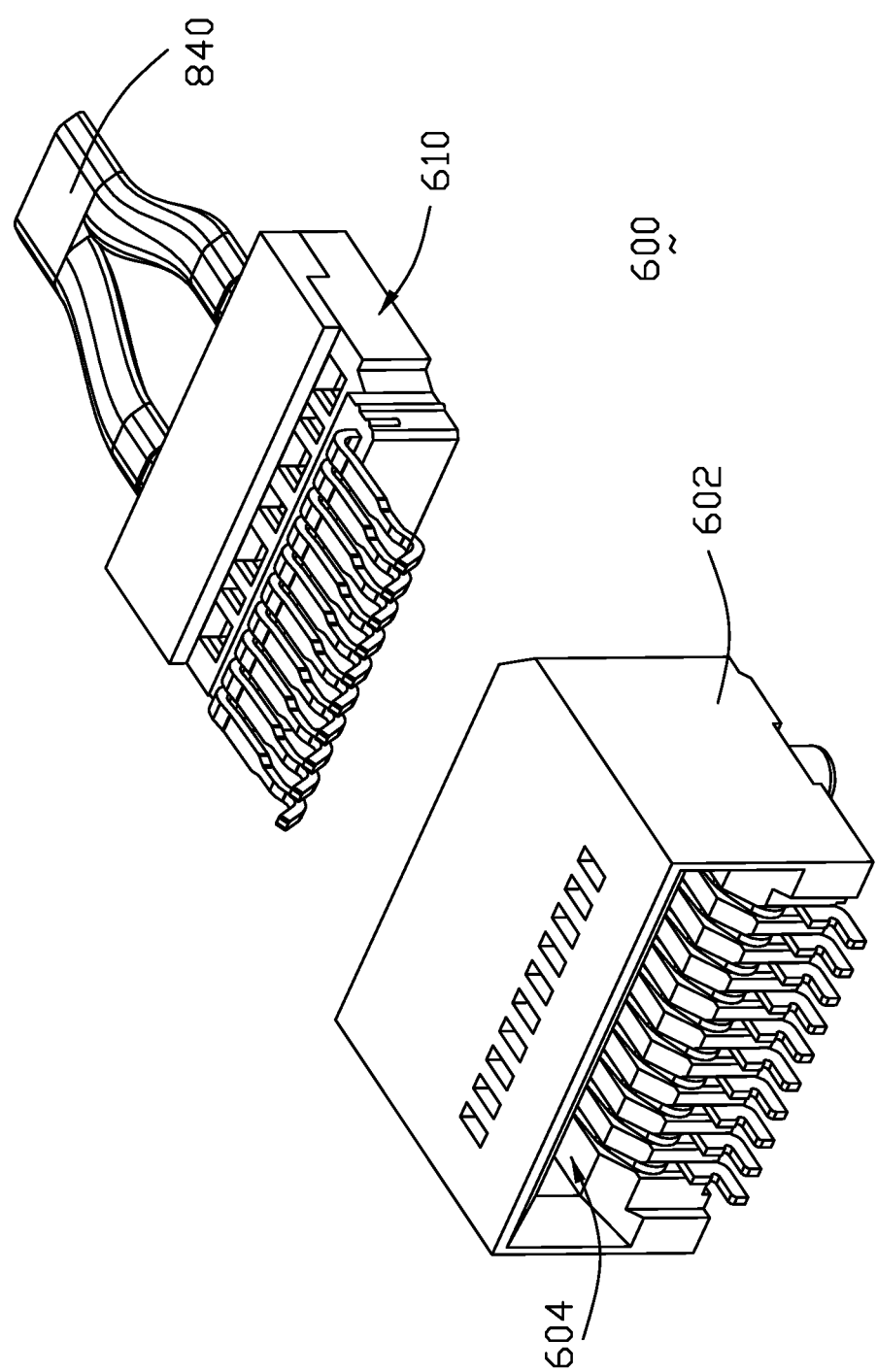
FIG. 8(C) is another exploded perspective view of the cable receptacle connector added with the contacts belonged to VCC of the electrical interconnection system of FIG. 8(A).

Referring to FIGS. 1(A) to 5(C), similar to what is disclosed in the second embodiment of the aforementioned provisional application 62/645,823, an electrical assembly 500 includes a periphery side 502 and a system side 702 linked to each other. The periphery side 502 includes a printed circuit board 510 defining opposite top/first and bottom/second surfaces 512, 514 in the vertical direction. A first/upper metallic cage 520 is mounted upon the first surface 512 via mounting legs (not labeled), and a second/lower metallic cage 522 is mounted upon the second surface 514 via mounting legs (not labeled). Each of the first cage 520 and the second cage 522 includes a main body 524, a seat cover 526 and a plurality of dividers 528 assembled together to commonly defines a plurality of receiving cavities 532 for receiving corresponding SFP modules (not shown). The seat cover 526 forms a deflectable locking tab 530 for engagement with the inserted SFP module (not fully shown but a mating tongue 10 thereof). A metallic gasket structure 521 surrounds each if the first cage 520 and the second cage 522 around the corresponding front openings of the receiving cavities 532.

Referring to FIGS. 6(A) to 12(B), a cable receptacle connector 600 is located around a rear end of each receiving cavity 532 and includes an insulative housing 602 forming a mating slot 604 in a front portion for receiving a mating part of the inserted SFP module (not fully shown but a mating tongue 10 thereof) and a receiving space 606 in a rear portion to receive the contact module 610. A plurality of floor passageways 612 and a plurality of ceiling passageways 614 are formed in the housing 602. A plurality of floor contacts 616 are retained in the corresponding floor passageways 612. Each of the floor contacts 616 has a front contacting section 613 extending into the mating slot 604 and a rear connecting section 615 mounted to the printed circuit board 510. Understandably, the floor contacts 616 includes the so-called sideband contacts and grounding contacts thereof, The contact module 610 includes a plurality of ceiling contacts 618 integrally formed within an insulator 620 and extending into the corresponding ceiling passageways 614. Each of the ceiling contacts 618 includes a front contacting section 617 extending into the mating slot 604 and a rear connecting section 619. The ceiling contacts 618 are arranged with two high speed groups each having four contacts 618 wherein the rear connecting sections 619 of middle two contacts 618 are mechanically and electrically connected to a differential pair wires 650, while those of the two outer contacts 619 are unitarily formed with a grounding plate G on which the drain wire 652 and/or a braiding foil 654 of the differential pair wires 650 is connected. Notably, the middle two contacts between two groups belong to VCC. An insulative cover 630 is attached upon the insulator 620 to protect the connection between the differential pair wires 650 and the rear connecting sections 619 of the ceiling contacts 618 including the grounding plate G.

Referring to FIGS. 13(A) to 18, a plurality of board-mount receptacle connectors 170 are mounted upon the main board 710. Similar to and simplified from the first embodiment of the aforementioned provisional application 62/645, 823, each of the board-mount receptacle connectors 170 has an insulating housing 172 with a receiving space 174 to receive a terminal module 176 therein. The terminal module 176 includes an upper terminal unit 178 and a lower terminal unit 180 to commonly sandwich a middle grounding unit 182 therebetween, wherein the upper terminal unit 178 includes a plurality of upper terminals 177 integrally formed with an upper insulator 179, the lower terminal unit 180 includes a plurality of lower terminals 181 integrally formed with a lower insulator 183. The upper terminals 177 and the lower terminals 181 have corresponding contacting sections extending into the mating slot 171 in the housing 172 for mating with a mating tongue 190 of a corresponding cable plug connector 192. The upper insulator 179 forms a groove 189 to receive a corresponding protrusion 187 of the lower insulator 183 for retention between the upper terminal unit 178 and the lower terminal unit 180. A base 185 is located below the lower terminal unit 180 and assembled to the housing 172 so as to regulate the tails of the both the upper terminal unit 178 and the lower terminal unit 180 for surface mounting to the main board 710. Notably, there are two rows of board-mount receptacle connectors 170 respectively mounted upon opposite top and bottom surfaces of the main board 710 and offset from each other in the front-to-back direction and respectively by two sides of the CPU or IC chip heat sink set 100, viewed along a transverse direction perpendicular to both the vertical direction and the front-to-back direction, for easy conductive trace routing on the main board 710. In a top view, the board-mount receptacle connectors 170 in the front row (on the upper surface of the main board 710) are aligned with the board-mount receptacle connector 170 in the rear row (on the lower surface of the main board 710) in the front-to-back direction, respectively.

Figure 9A:
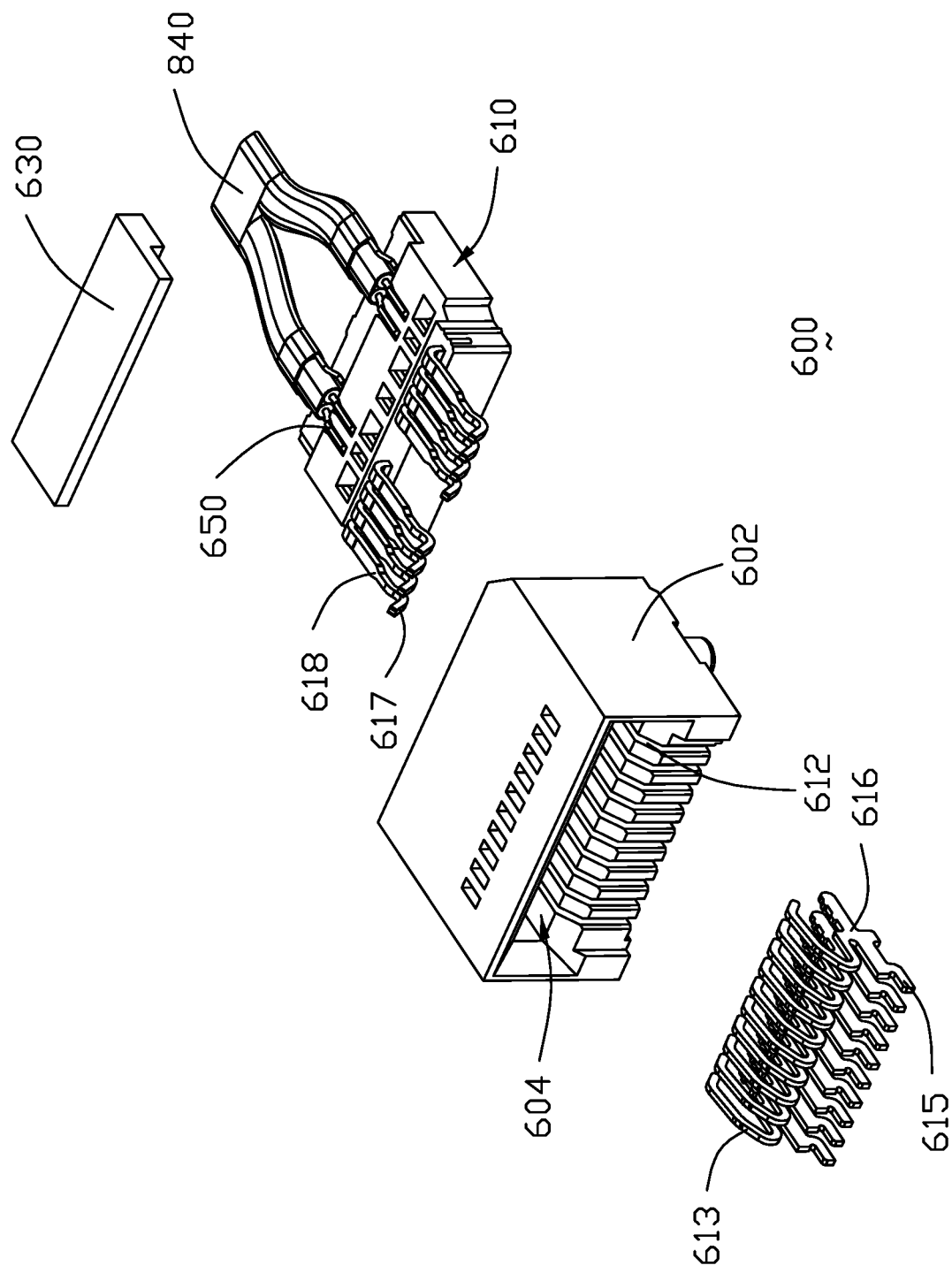
FIG. 9(A) is a further exploded perspective view of the cable receptacle connector with the associated cable of the electrical interconnection system of FIG. 8(A)
Figure 9B:
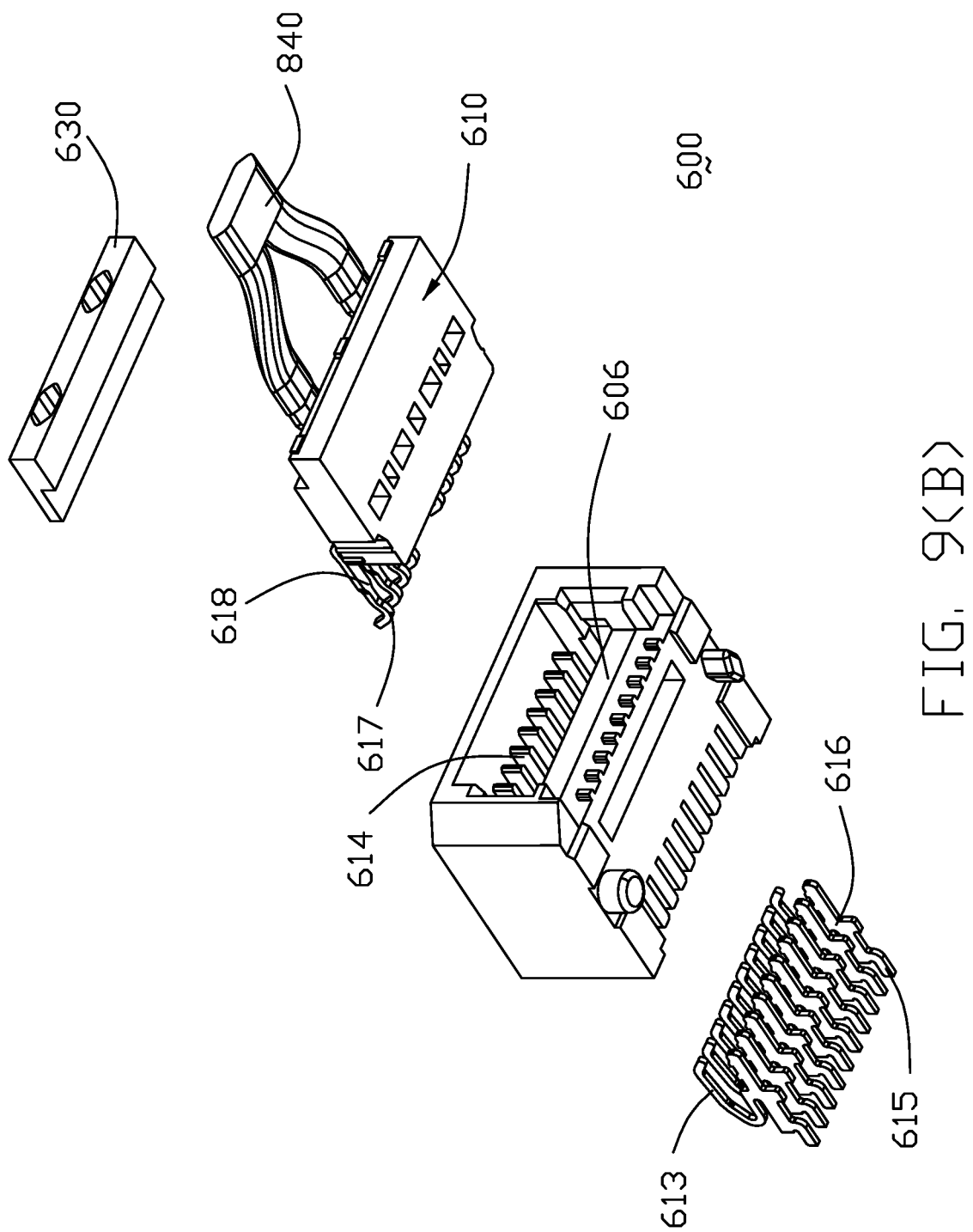
FIG. 9(B) is another exploded perspective view of the cable receptacle connector with the associated cable of the electrical interconnection system of FIG. 9(A)
Figure 10A:
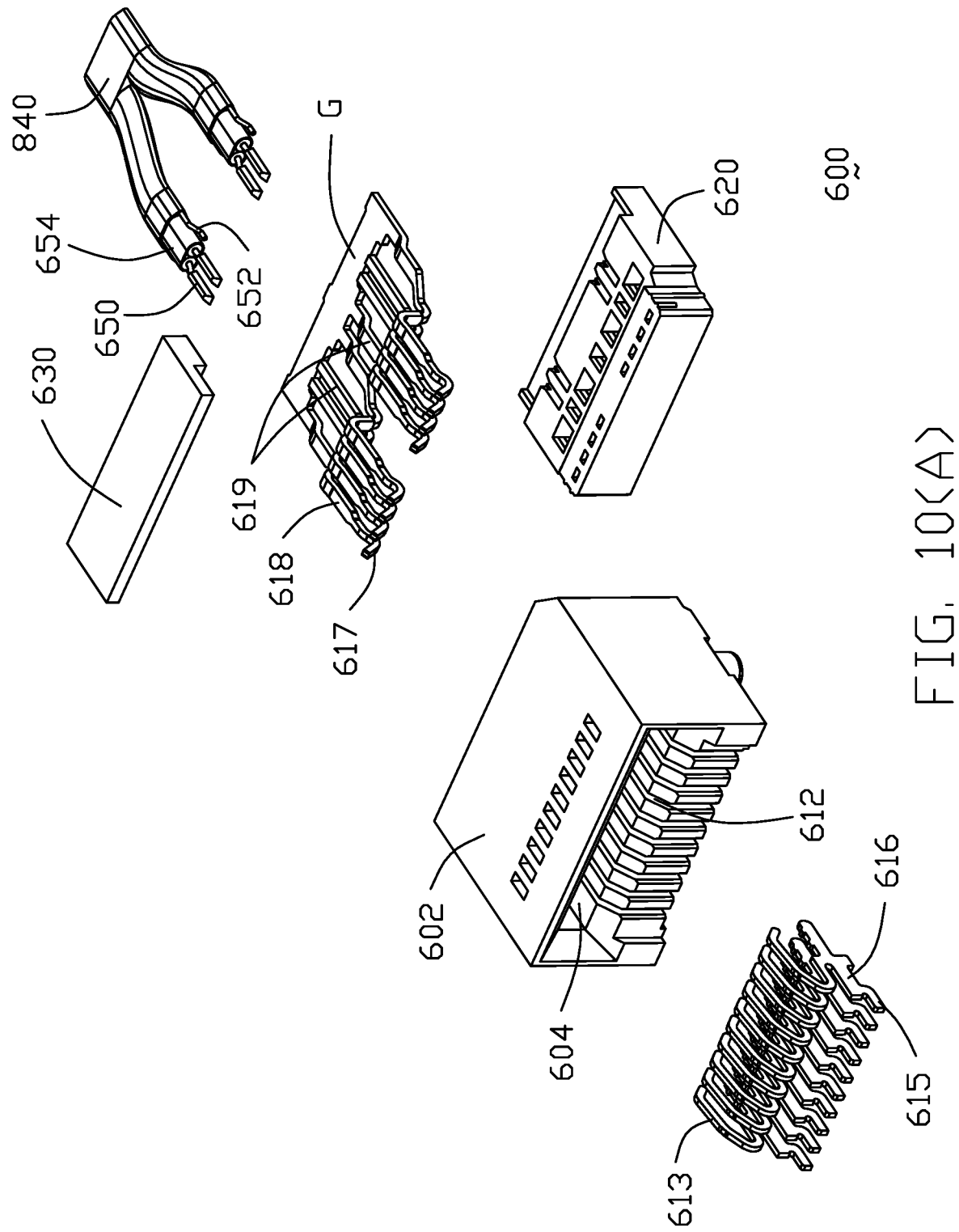
FIG. 10(A) is a further exploded perspective view of the cable receptacle connector with the associated cable of the electrical interconnection system of FIG. 9(A)
Figure 10B:
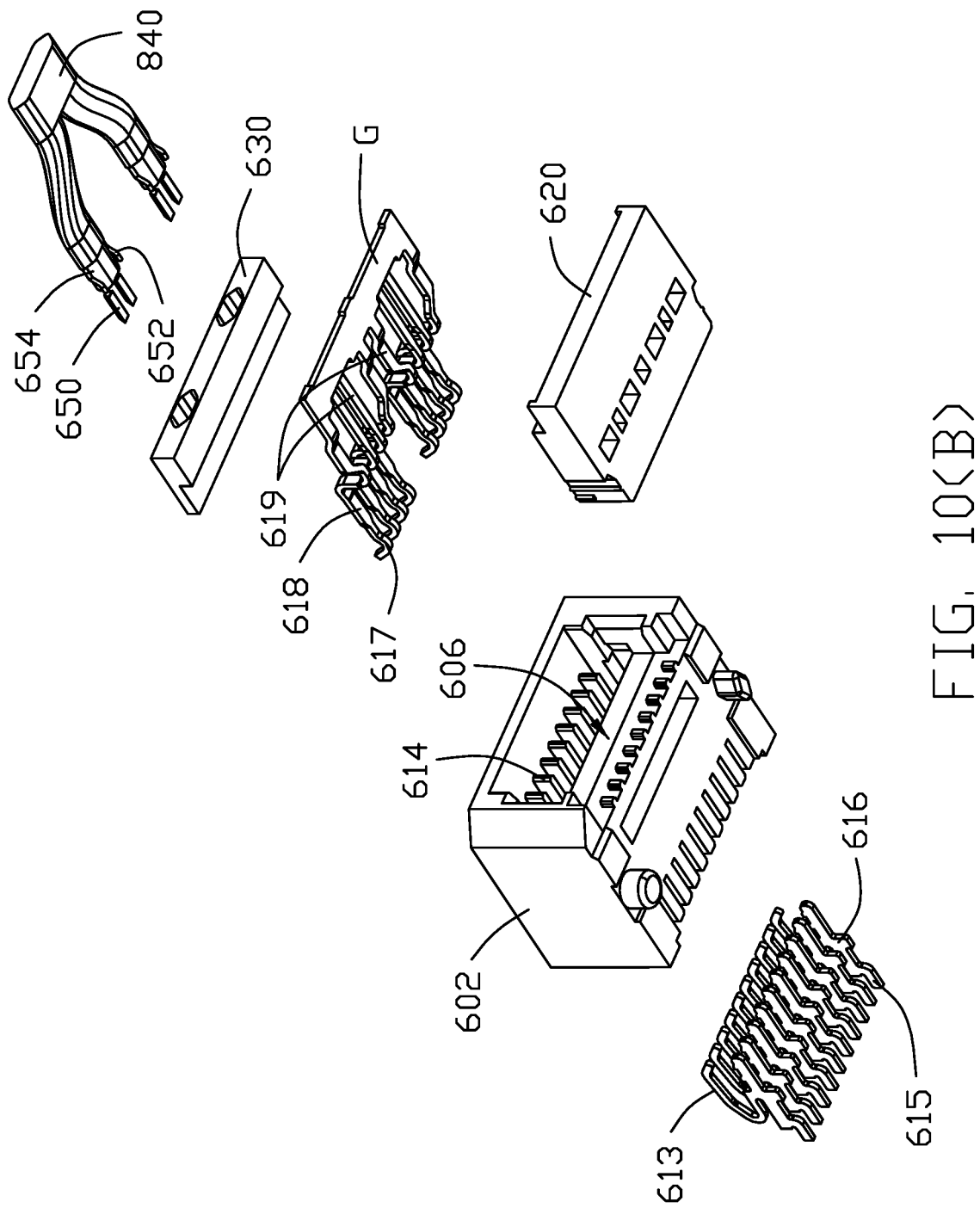
FIG. 10(B) is another exploded perspective view of the cable receptacle connector with the associated cable of the electrical interconnection system of FIG. 10(A)
Figure 11A:
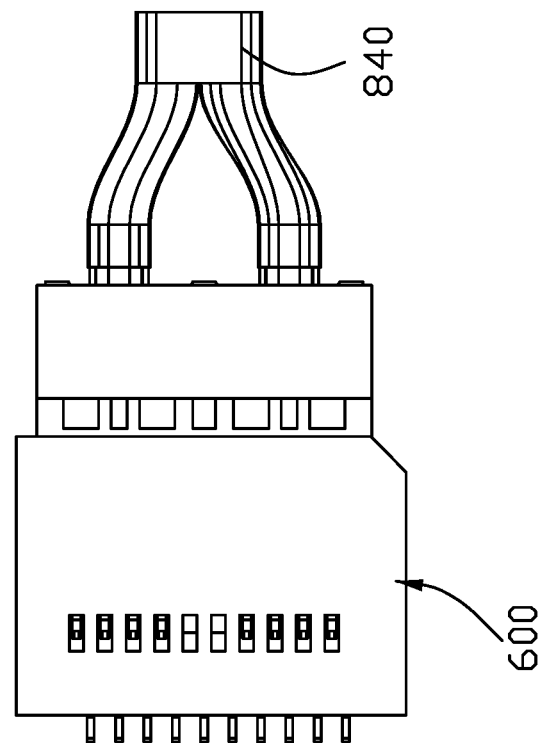
FIG. 11(A) is a top view of the cable receptacle connector and the mating tongue of the corresponding SFP module of the electrical interconnection system of FIG. 7.
Figure 11A:
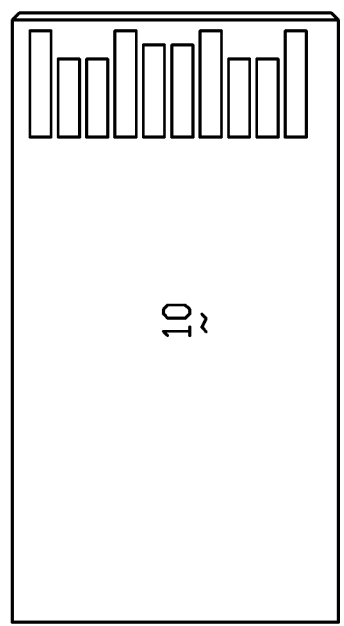
Figure 11B:
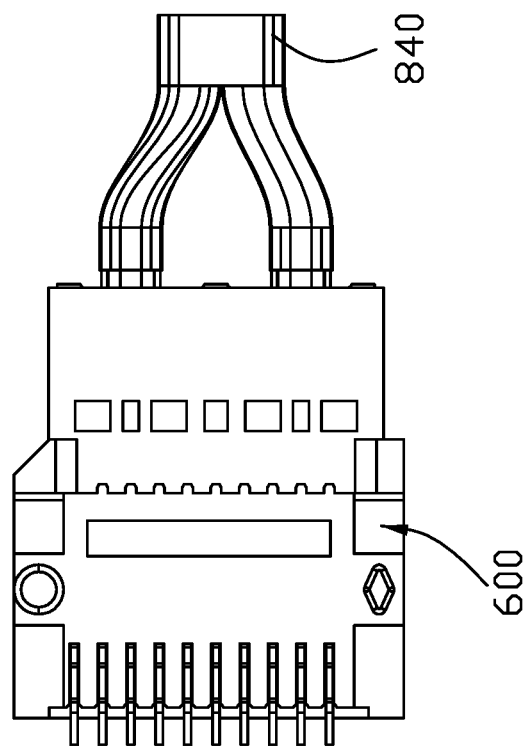
FIG. 11(B) is a bottom view of the cable receptacle connector and the mating tongue of the corresponding SFP module of the electrical interconnection system of FIG. 11(A)
Figure 11B:
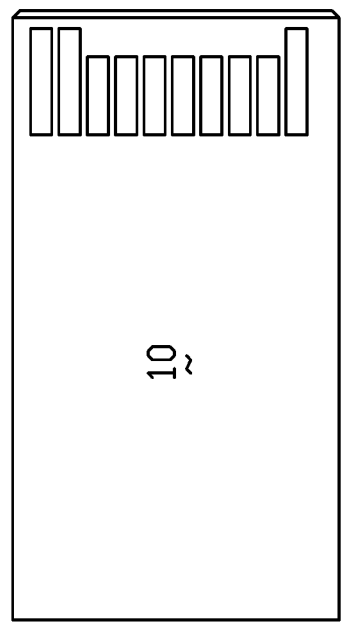
Figure 12A:
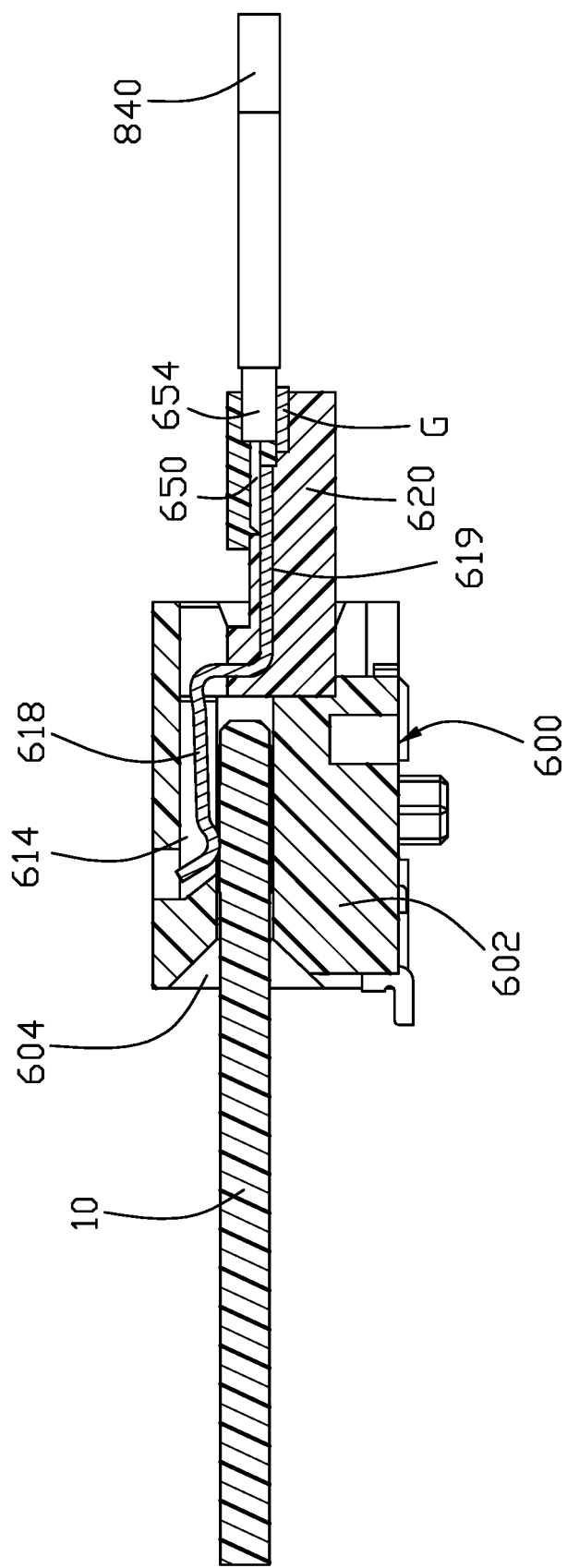
FIG. 12(A) is a cross-sectional view of the cable receptacle connector and the mating tongue of the corresponding SFP module of the electrical interconnection system of FIG. 11(A) wherein the mating tongue is inserted into the mating slot of the cable receptacle connector.
Figure 12B:
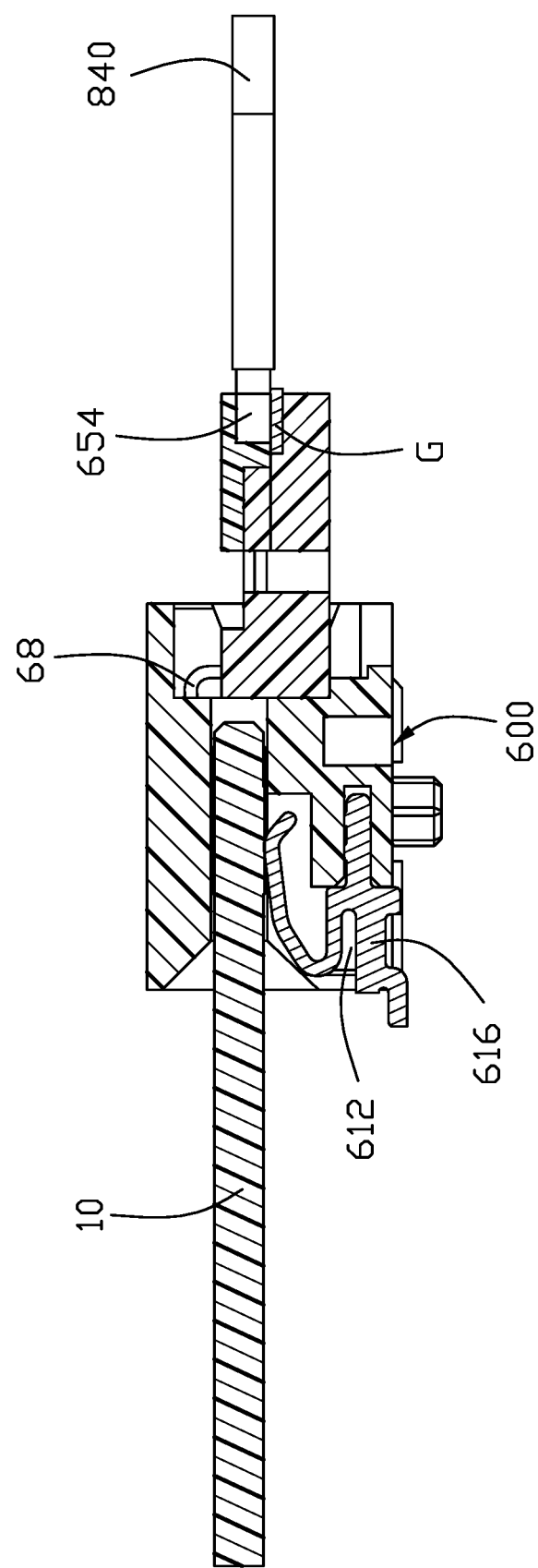
FIG. 12(B) is another cross-sectional view of the cable receptacle connector and the mating tongue of the corresponding SFP module of the electrical interconnection system of FIG. 11(A) wherein the mating tongue is inserted into the mating slot of the cable receptacle connector.
Figure 13A:
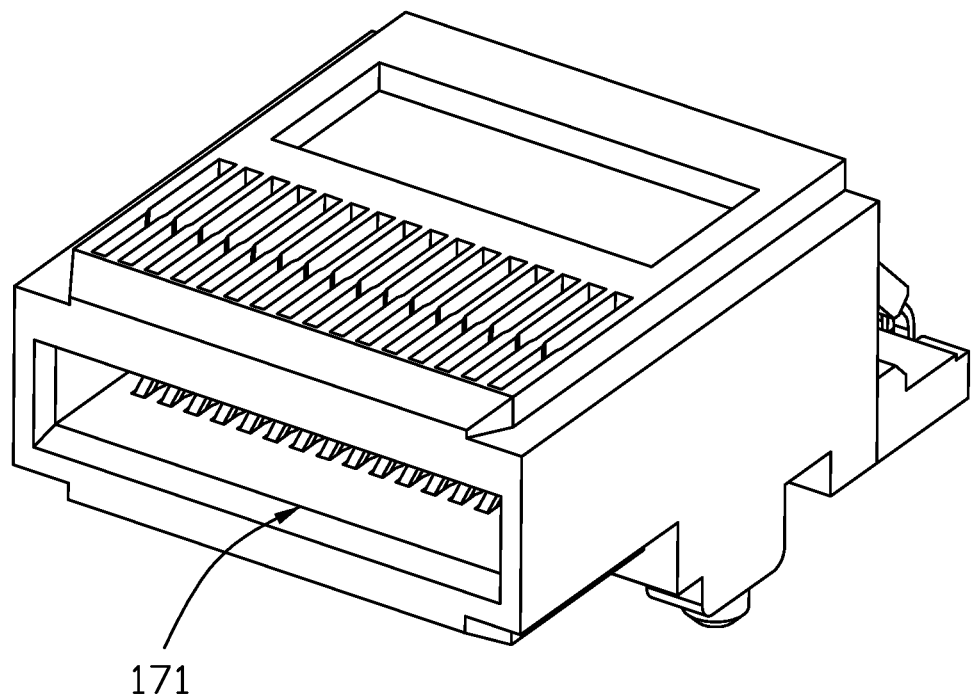
FIG. 13(A) is a perspective view of the board-mount receptacle connector of the electrical interconnection system of FIG. 1.
Figure 13B:
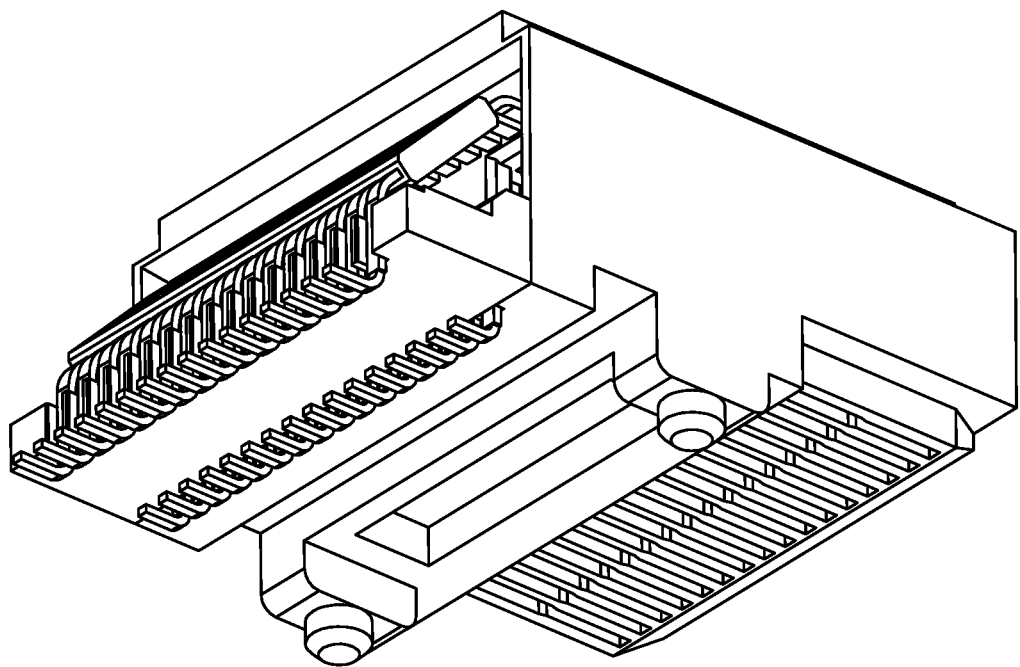
FIG. 13(B) is another perspective view of the board-mount receptacle connector of the electrical interconnection system of FIG. 13(A)
Figure 14A:
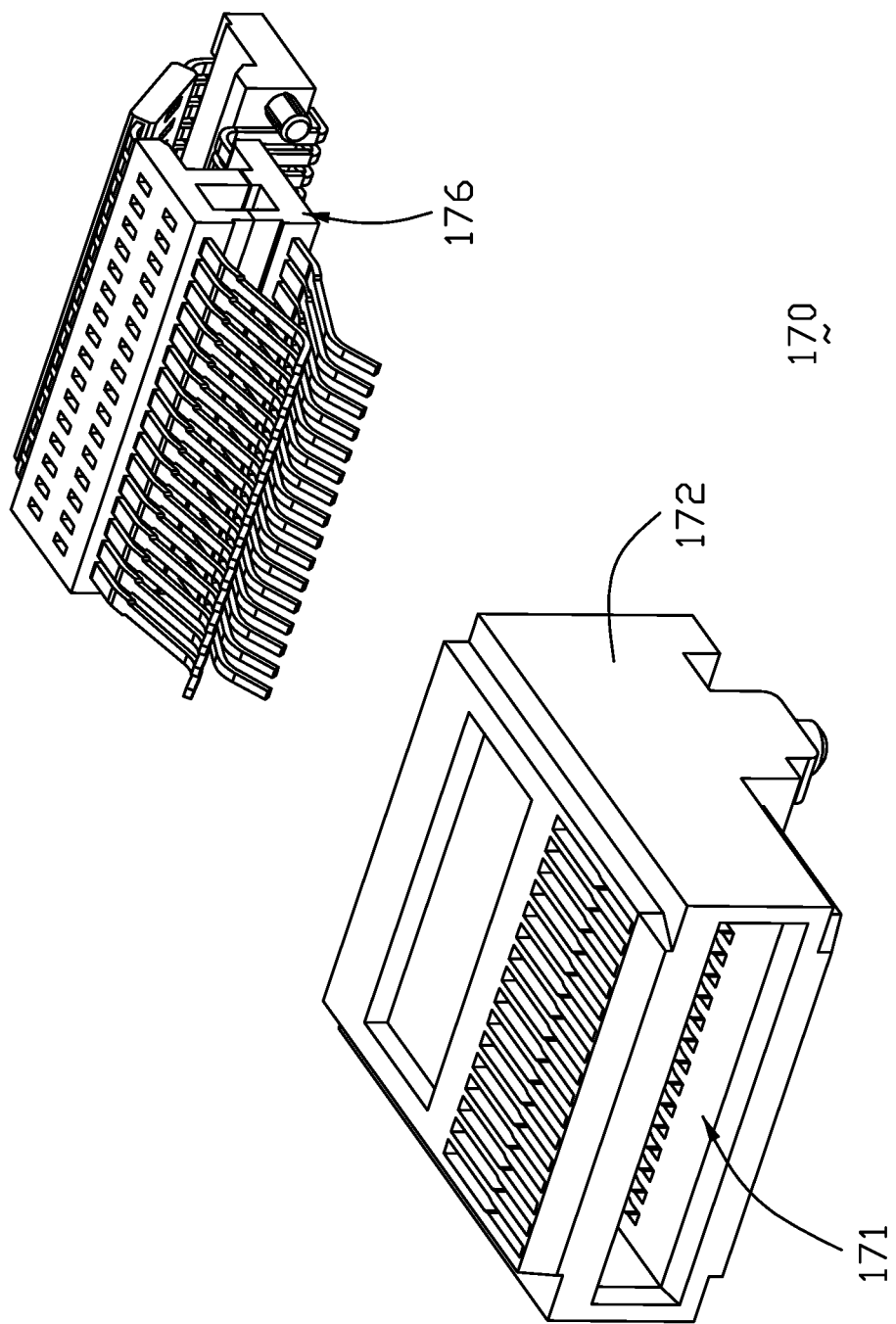
FIG. 14(A) is an exploded perspectives view of the board-mount receptacle connector of the electrical interconnection system of FIG. 13(A)
Figure 14B:
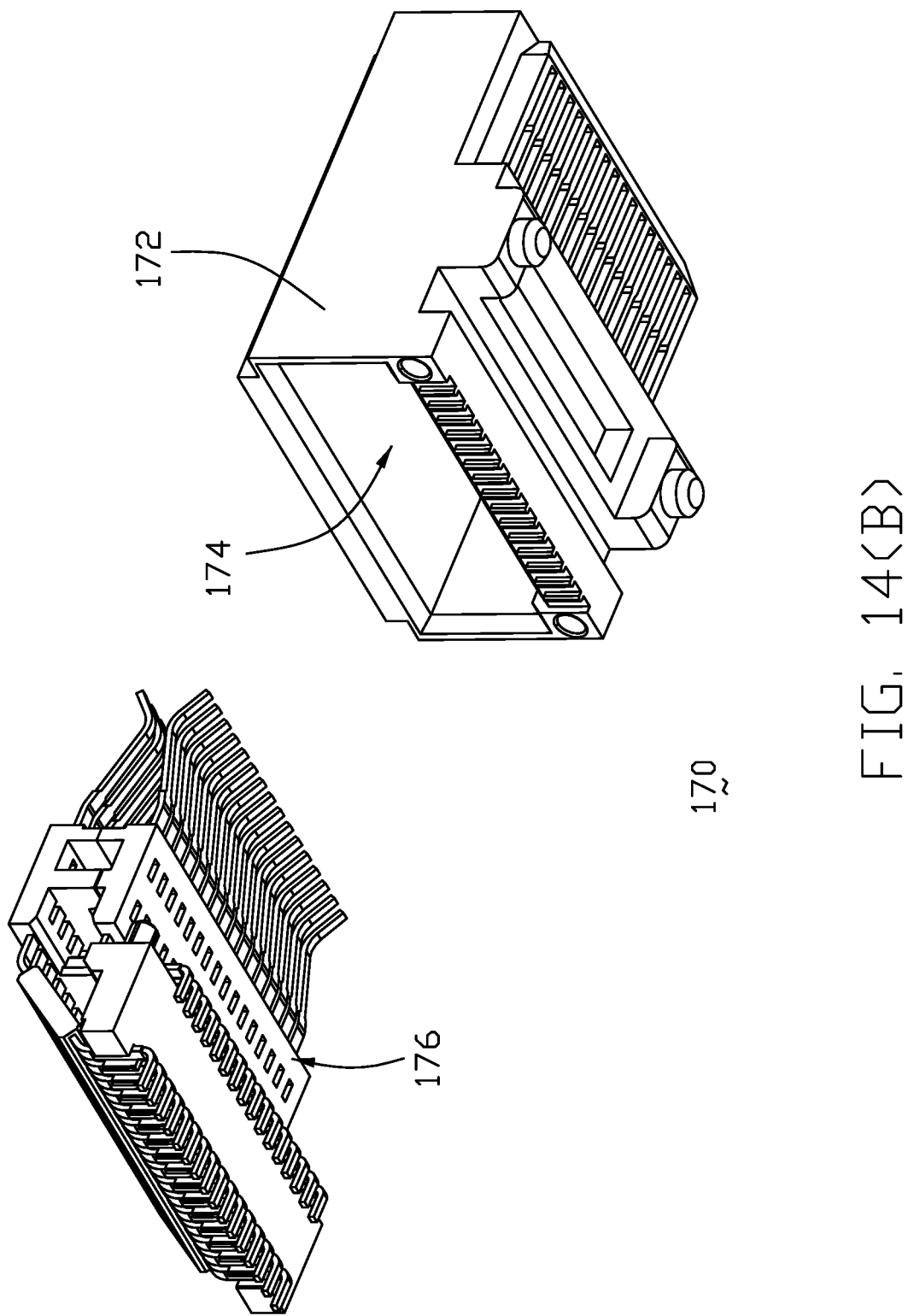
FIG. 14(B) is another exploded perspective view of the board-mount receptacle connector of the electrical interconnecting system of FIG. 14(A)
Figure 15A:
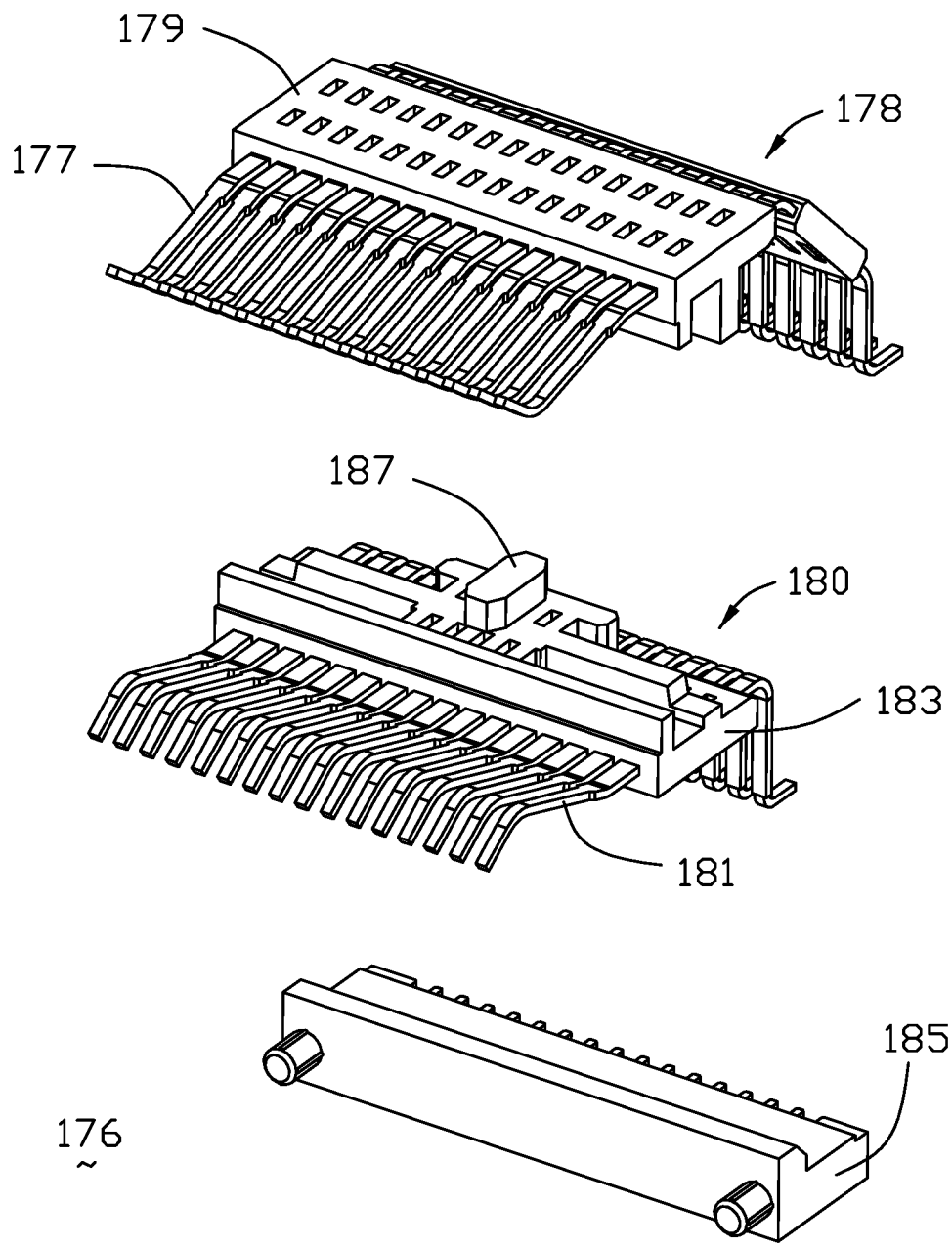
FIG. 15(A) is an exploded perspective view of the terminal module of the board-mount receptacle connector of the electrical interconnection system of FIG. 1.
Figure 15B:
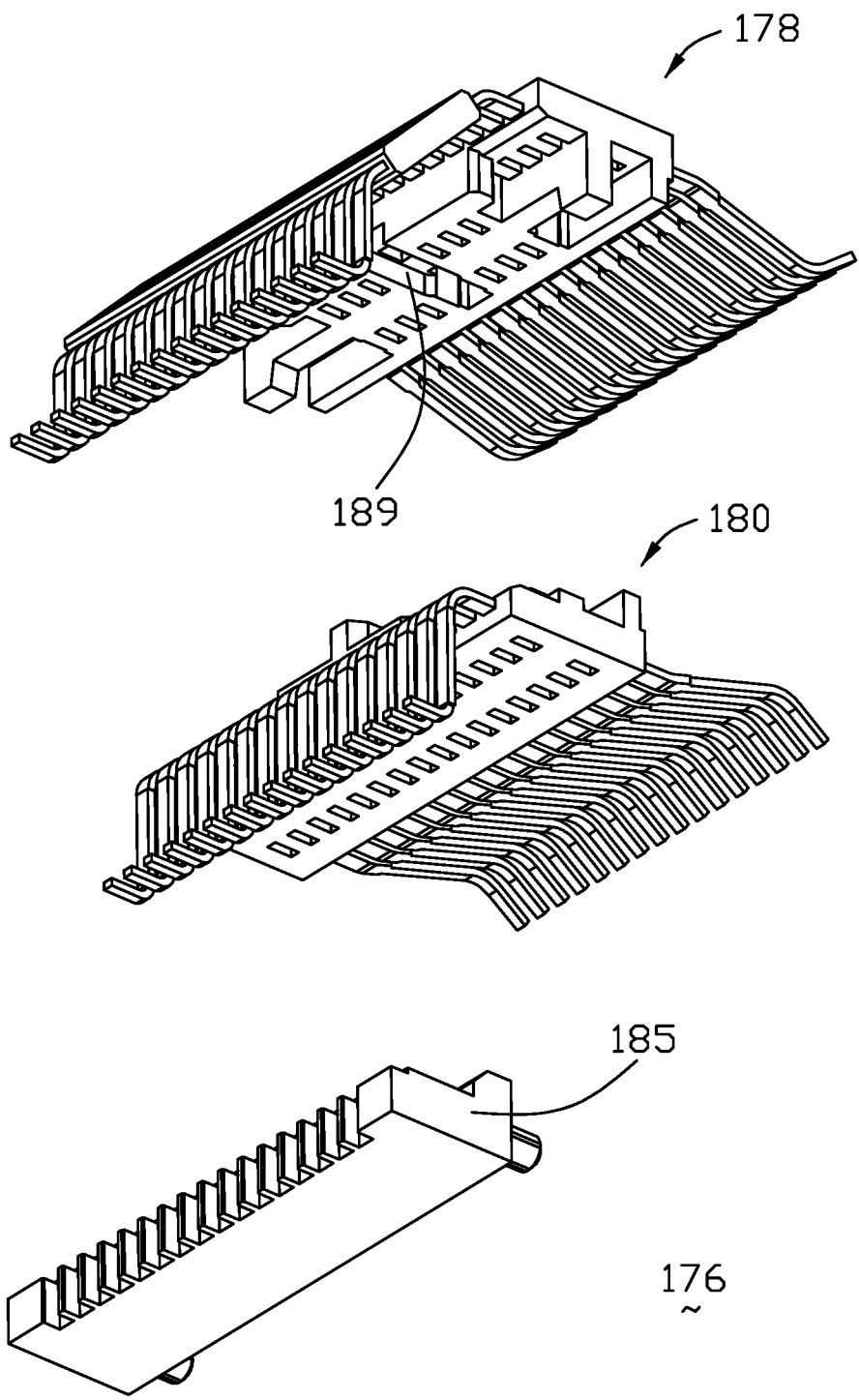
FIG. 15(B) is another exploded perspective view of the board-mount receptacle connector of the interconnection system of FIG. 13(A)
Figure 16:
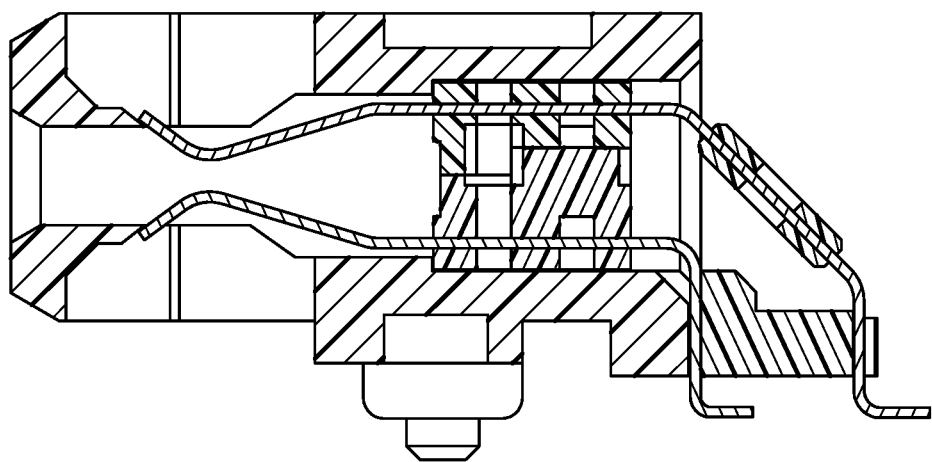
FIG. 16 is a cross-sectional view of the board-mount receptacle connector of the interconnection system of FIG. 13(A)
Figure 17A:
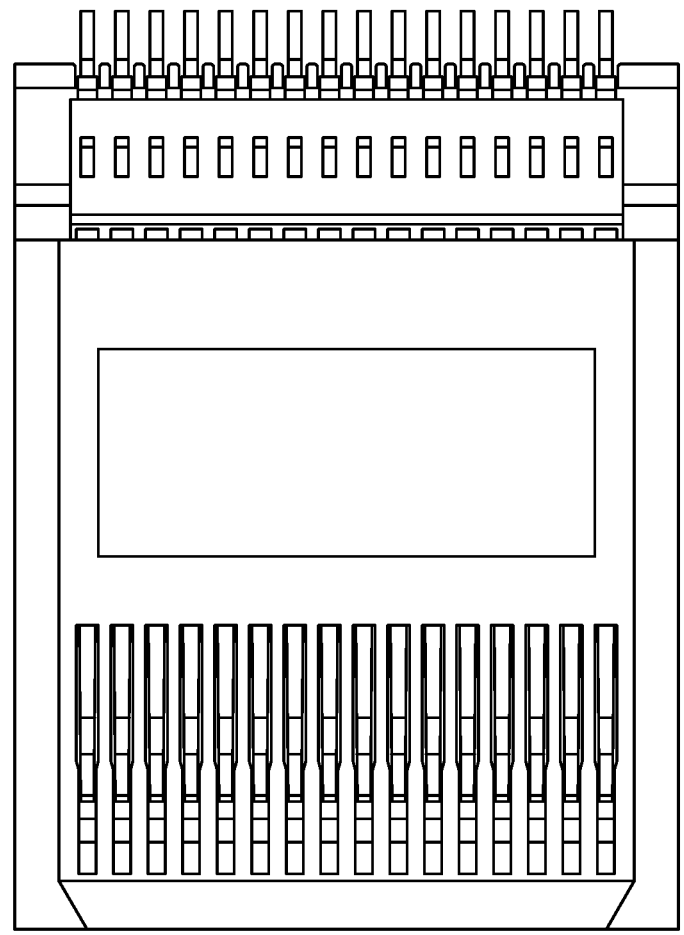
FIG. 17(A) is a top view of the board-mount receptacle connector of the interconnection system of FIG. 13(A)
Figure 17B:
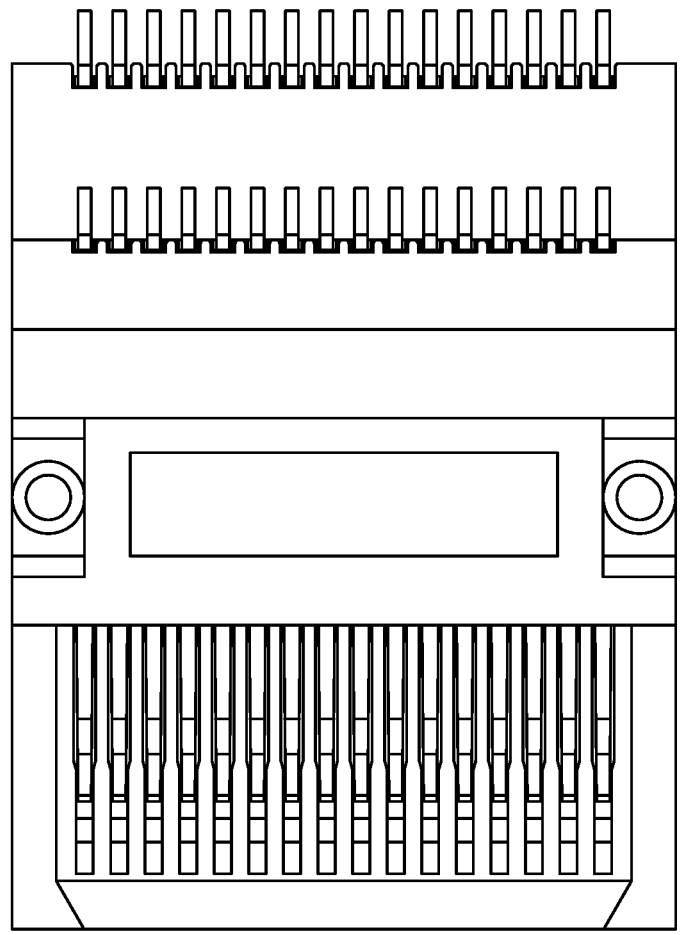
FIG. 17(B) is a bottom view of the contact module subassembly of the board-mount receptacle connector of FIG. 13(B)
Figure 18:
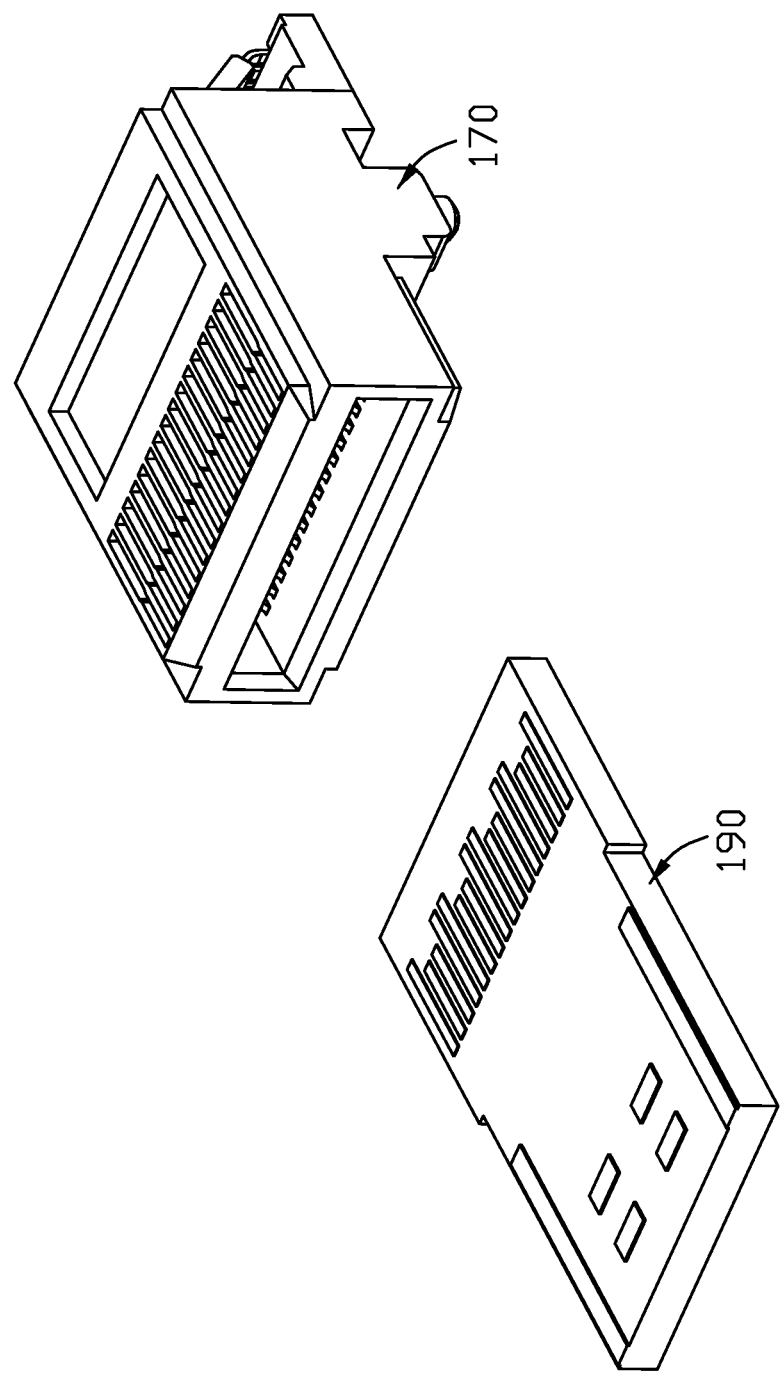
FIG. 18 is a perspective view of the board-mount receptacle connector and the corresponding mating tongue of the cable plug connector of the electrical interconnection system of FIG. 1.

Referring to FIGS. 1(A) to 12(B), a plurality of cables 840 are linked between the cable plug connectors 192 and the corresponding cable receptacle connectors 600 along the front-to-back direction. Each cable 840 is connected to one cable plug connector 192 at one end around the system side 702 for mating with one board-mount receptacle connector 170 while respectively connected to four cable receptacle connectors 600 via four sets of differential pair wires 650 at the other end around the periphery side 502 wherein each set of differential pair wires 650 have two pairs as shown in the leftmost one cable 840 in FIG. 2(A) and the rightmost one cable 840 in FIG. 2(B), for mechanically and electrically connecting to the corresponding two inner pairs of the contacts 618 as shown in FIGS. 9(A) and 9(B). Notably, the four cable receptacle connectors 600 corresponding to the same one cable 840, are arranged in two neighboring mating cavities 532 in the upper cage 520 and two neighboring mating cavities 532 in the lower cage 522 which are vertically aligned with the aforementioned two neighboring mating cavities 532. In addition, the cables 840, which are arranged in one row around the rear edge of the printed circuit board 510 at one end for coupling to the four corresponding cable receptacle connectors 600, are arranged in two rows around the system side 702 sequentially, in a staggered manner, alternately on the top surface and the bottom surface of the main board 710 so as to efficiently use the available room in both the periphery side 502 and the system side 702 without intermixing the cables 840.

On feature of the invention is to have the cables 840 arranged between a 48-port periphery side, i.e., 2×24, and a 12-port system side, i.e., 2×6, in a fan-out manner. In other words, the transverse dimension of the port assembly on the periphery side is around five times of that on the system side. Also, the two rows of board-mount receptacle connectors 170 are respectively located by two sides of the heat sink set 100 can minimize the conductive traces linked to the CPU or IC chip under the heat sink set 100 advantageously. In this embodiment, the first printed circuit board and the second printed circuit board are discrete and spaced from each other while alternately both of them may be joined together, if proper.

What is claimed is:

1. An electrical interconnection system comprising:
a periphery side comprising:
a first printed circuit board;
a plurality of cages mounted on the first printed circuit board, a plurality of cavities formed in the corresponding cages for receiving a plurality of modules therein, respectively;
a plurality of cable receptacle connectors located at rear portions of said receiving cavities, respectively;
a system side comprising:
a second printed circuit board;
an IC chip mounted on the second printed circuit board;
a plurality of board-mount receptacle connectors mounted upon the second printed circuit board; and
a plurality of cables connected between the cable receptacle connectors and the board-mount receptacle connectors; wherein
the board-mount receptacle connectors are arranged in an upper row and a lower row, and mounted on two opposite top and bottom surfaces of the second printed circuit board, wherein the cages and the cable receptacle connectors are arranged in an upper and a lower row, and are mounted on two opposite top and bottom surfaces of the first printed circuit board, wherein each of said cables having one end is connected to one corresponding board-mount receptacle connector, and the other end is connected to two neighboring cable receptacle connectors in the upper row and two neighboring cable receptacle connectors in the lower row, wherein said two neighboring cable receptacle connectors in the upper row are aligned with two neighboring cable receptacle connectors in the lower row in the vertical direction, respectively, wherein each of said cable includes four sets of different pair contacts, and each set includes two pairs.

2. The interconnection system as claimed in claim 1, wherein each cable is integrally connected to the corresponding cable receptacle connectors while is detachably connected to the corresponding board-mount receptacle connector through a cable plug connector mated with the corresponding board-mount receptacle connector.

3. The interconnection system as claimed in claim 1, wherein the upper row of board-mount receptacle connectors are offset from the lower row of board-mount receptacle connectors in a front-to-back direction.

4. The interconnection system as claimed in claim 3, wherein the upper row of board-mount receptacle connectors and the lower row of board-mount receptacle connectors are respectively located by two sides of an IC chip heat sink set in the front-to-back direction.

5. The interconnection system as claimed in claim 1, wherein the cables are alternately connected to the upper row of board-mount receptacle connectors and the lower row of board-mount receptacle connectors in a staggered manner in sequence.

6. The interconnection system as claimed in claim 1, wherein the upper row of board-mount receptacle connectors and the lower row of board-mount receptacle connectors are aligned with each other in a front-to-back direction in a top view.

7. The interconnection system as claimed in claim 1, wherein said first printed circuit board and said second printed circuit board are discrete and spaced from each other.

8. An interconnection system comprising:
a periphery side comprising:
a first printed circuit board;
a plurality of cages mounted on the first printed circuit board, a plurality of cavities formed in the corresponding cages for receiving a plurality of modules therein, respectively;
a plurality of cable receptacle connectors located at rear portions of said receiving cavities, respectively;
a system side comprising:
a second printed circuit board;
an IC chip mounted on the second printed circuit board;
a plurality of board-mount receptacle connectors mounted upon the second printed circuit board; and
a plurality of cables connected between the cable receptacle connectors and the board-mount receptacle connectors; wherein
each of said cable receptacle connector includes an insulative housing with a horizontal mating slot, a plurality of floor contacts retained in the housing, located by one side of the mating slot closer to the first printed circuit board and mechanically and electrically connected to the first printed circuit board, and a plurality of ceiling contacts disposed in the housing, located by the other side of the mating slot farther from the first printed circuit board and mechanically and electrically connected to the corresponding one cable, wherein the ceiling contacts are integrally formed within an insulator to form a contact module received within a receiving space in a rear portion of the housing, wherein the ceiling contacts are arranged with two groups with a space therebetween in a transverse direction, and each group has a pair of grounding contacts commonly sandwiching a differential pair contacts therebetween in said transverse direction, the ceiling contacts in each group defines a pitch and said space occupies two pitches, wherein an insulative cover is attached upon the insulator to cover joints between the able and the ceiling contacts.

9. An interconnection system comprising: a periphery side comprising: a first printed circuit board; a plurality of cages mounted on the first printed circuit board, a plurality of cavities formed in the corresponding cages for receiving a plurality of modules therein, respectively; a plurality of cable receptacle connectors located at rear portions of said receiving cavities, respectively; a system side comprising: a second printed circuit board; an IC chip mounted on the second printed circuit board; a plurality of board-mount receptacle connectors mounted upon the second printed circuit board; and a plurality of cables connected between the cable receptacle connectors and the board-mount receptacle connectors; wherein each of said cable receptacle connector includes an insulative housing with a horizontal mating slot, a plurality of floor contacts retained in the housing, located by one side of the mating slot closer to the first printed circuit board and mechanically and electrically connected to the first printed circuit board, and a plurality of ceiling contacts disposed in the housing, located by the other side of the mating slot farther from the first printed circuit board and mechanically and electrically connected to the corresponding one cable, wherein the ceiling contacts are integrally formed within an insulator to form a contact module received within a receiving space in a rear portion of the housing, wherein the ceiling contacts are arranged with two groups with a space therebetween in a transverse direction, and each group has a pair of grounding contacts commonly sandwiching a differential pair contacts therebetween in said transverse direction, the ceiling contacts in each group defines a pitch and said space occupies two pitches, wherein the floor contacts are rearwardly assembled into the housing from a front side of the housing, and the ceiling contacts are forwardly assembled into the housing form a rear side of the housing.

* * * * *